(12) United States Patent
Kubo

(10) Patent No.: US 12,371,785 B2
(45) Date of Patent: Jul. 29, 2025

(54) METHOD FOR FORMING FILM ON SUBSTRATE SURFACE HAVING CONVEX PORTION

(71) Applicant: Tokyo Electron Limited, Tokyo (JP)

(72) Inventor: Kazumi Kubo, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/476,804

(22) Filed: Sep. 28, 2023

(65) Prior Publication Data
US 2024/0124976 A1 Apr. 18, 2024

(30) Foreign Application Priority Data
Oct. 12, 2022 (JP) .................. 2022-163712

(51) Int. Cl.
*C23C 16/04* (2006.01)
*C23C 16/40* (2006.01)
*C23C 16/455* (2006.01)

(52) U.S. Cl.
CPC ...... *C23C 16/45529* (2013.01); *C23C 16/045* (2013.01); *C23C 16/401* (2013.01); *C23C 16/45553* (2013.01)

(58) Field of Classification Search
CPC ............ C23C 16/45529; C23C 16/045; C23C 16/401; C23C 16/345; C23C 16/45553
See application file for complete search history.

(56) References Cited

U.S. PATENT DOCUMENTS

| 6,869,641 B2 * | 3/2005 | Schmitt ............. C23C 16/45525 |
| | | 427/248.1 |
| 7,338,576 B2 * | 3/2008 | Ono .................. H01J 37/32623 |
| | | 156/345.46 |

(Continued)

FOREIGN PATENT DOCUMENTS

| JP | 2015-220293 | 12/2015 |
| JP | 2017-120884 | 7/2017 |

OTHER PUBLICATIONS

Dickey, E., et al., "High Speed Rotary Spatial ALD for Commercial Applications". Society of Vacuum Coaters57th Annual Technical Conference Proceedings, Chicago, IL May 3-8, 2014, pp. 82-90.*

(Continued)

*Primary Examiner* — Bret P Chen
(74) *Attorney, Agent, or Firm* — IPUSA, PLLC

(57) ABSTRACT

A film forming method includes causing adsorption of a source gas on a substrate surface having a convex portion, and forming a film on the substrate surface using a thermal reaction between the adsorbed source gas and a reactive gas. The substrate is disposed on a surface of a turntable provided inside a vacuum chamber. An adsorption region in which the causing is performed, and a reaction region in which the forming is performed, are provided inside the vacuum chamber above the turntable along a circumferential direction of the turntable. The causing and the forming are repeated with respect to the substrate by rotating the turntable in a state where the source and reactive gases are supplied to the adsorption and reaction regions, respectively. At least one of the source gas supply and the reactive gas supply supplies the gas at an angle with respect to a vertically downward direction.

8 Claims, 16 Drawing Sheets

(56) References Cited

U.S. PATENT DOCUMENTS

| | | | | |
|---|---|---|---|---|
| 2003/0184697 A1* | 10/2003 | Ueda | ............... | G02F 1/136227 |
| | | | | 349/122 |
| 2004/0052972 A1* | 3/2004 | Schmitt | ............... | C30B 25/02 |
| | | | | 118/715 |
| 2011/0139192 A1* | 6/2011 | Koide | ............... | H01L 21/02057 |
| | | | | 134/94.1 |
| 2012/0276306 A1* | 11/2012 | Ueda | ............... | C23C 16/40 |
| | | | | 427/576 |
| 2014/0011372 A1* | 1/2014 | Kato | ............... | C23C 16/402 |
| | | | | 438/787 |
| 2014/0147591 A1* | 5/2014 | Ikegawa | ............... | C23C 16/45551 |
| | | | | 427/255.28 |
| 2014/0290578 A1* | 10/2014 | Wamura | ............... | C23C 16/45551 |
| | | | | 118/725 |
| 2015/0345015 A1* | 12/2015 | Chiba | ............... | C23C 16/45548 |
| | | | | 118/728 |
| 2018/0135178 A1* | 5/2018 | Miura | ............... | C23C 16/45578 |
| 2019/0136368 A1* | 5/2019 | Kim | ............... | C23C 14/352 |
| 2019/0157399 A1* | 5/2019 | Kosugi | ............... | H10D 62/81 |
| 2020/0335654 A1* | 10/2020 | Heckel | ............... | C23C 14/541 |

OTHER PUBLICATIONS

Im, Hyungsoon, et al., "Atomic layer deposition: A versatile technique for plasmonics and nanobiotechnology". J. Mater. Res., vol. 27, No. 4, Feb. 28, 2012, pp. 663-671.*

Grigoriev, F.V., et al., "Atomistic simulation of the glancing angle deposition of SiO2 thin films". Journal of Non-Crystalline Solids 512 (2019) 98-102.*

Robbie, K., et al., "Advanced techniques for glancing angle deposition". J. Vac. Sci. Technol. B 16(3), May/Jun. 1998, pp. 1115-1122.*

Barranco, Angel, et al., "Perspectives on oblique angle deposition of thin f ilms: From fundamentals to devices". Progress in Materials Science, 76 (2016) 59-143.*

* cited by examiner

METHOD FOR FORMING FILM ON SUBSTRATE SURFACE HAVING CONVEX PORTION

CROSS-REFERENCE TO RELATED APPLICATIONS

This application is based upon and claims priority to Japanese Patent Application No. 2022-163712, filed on Oct. 12, 2022, the entire contents of which are incorporated herein by reference.

BACKGROUND

1. Field of the Invention

The present disclosure relates to film forming methods and film forming apparatuses.

2. Description of the Related Art

As an example of a film forming apparatus that performs an atomic layer deposition (ALD), there is a known film forming apparatus including a turntable, as proposed in Japanese Laid-Open Patent Publication No. 2015-220293 and Japanese Laid-Open Patent Publication No. 2017-120884, for example). The turntable type film forming apparatus includes the turntable that is rotatably provided inside a vacuum chamber. Substrates are disposed on a surface of the turntable along a circumferential direction thereof. A source gas supply region, a reactive gas supply region, and a separation region for separating these supply regions, are provided above the turntable inside the vacuum chamber.

SUMMARY

According to one aspect of the embodiments, a film forming method includes causing adsorption of a source gas on a surface of a substrate having a convex portion on the surface, by supplying the source gas to the surface of the substrate; and forming a film on the surface of the substrate using a thermal reaction between the source gas adsorbed on the surface of the substrate and a reactive gas, by supplying the reactive gas to the surface of the substrate, wherein the substrate is one of a plurality of substrates disposed on a surface of a turntable provided inside a vacuum chamber along a circumferential direction of the turntable, an adsorption region in which the causing is performed, and a reaction region in which the forming is performed, are provided inside the vacuum chamber above the turntable along the circumferential direction of the turntable, the causing and the forming are repeated with respect to the substrate by rotating the turntable in a state where the source gas is supplied to the adsorption region from a source gas supply and the reactive gas is supplied to the reaction region from a reactive gas supply, and at least one of the source gas supply and the reactive gas supply supplies the gas at an angle with respect to a vertically downward direction.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
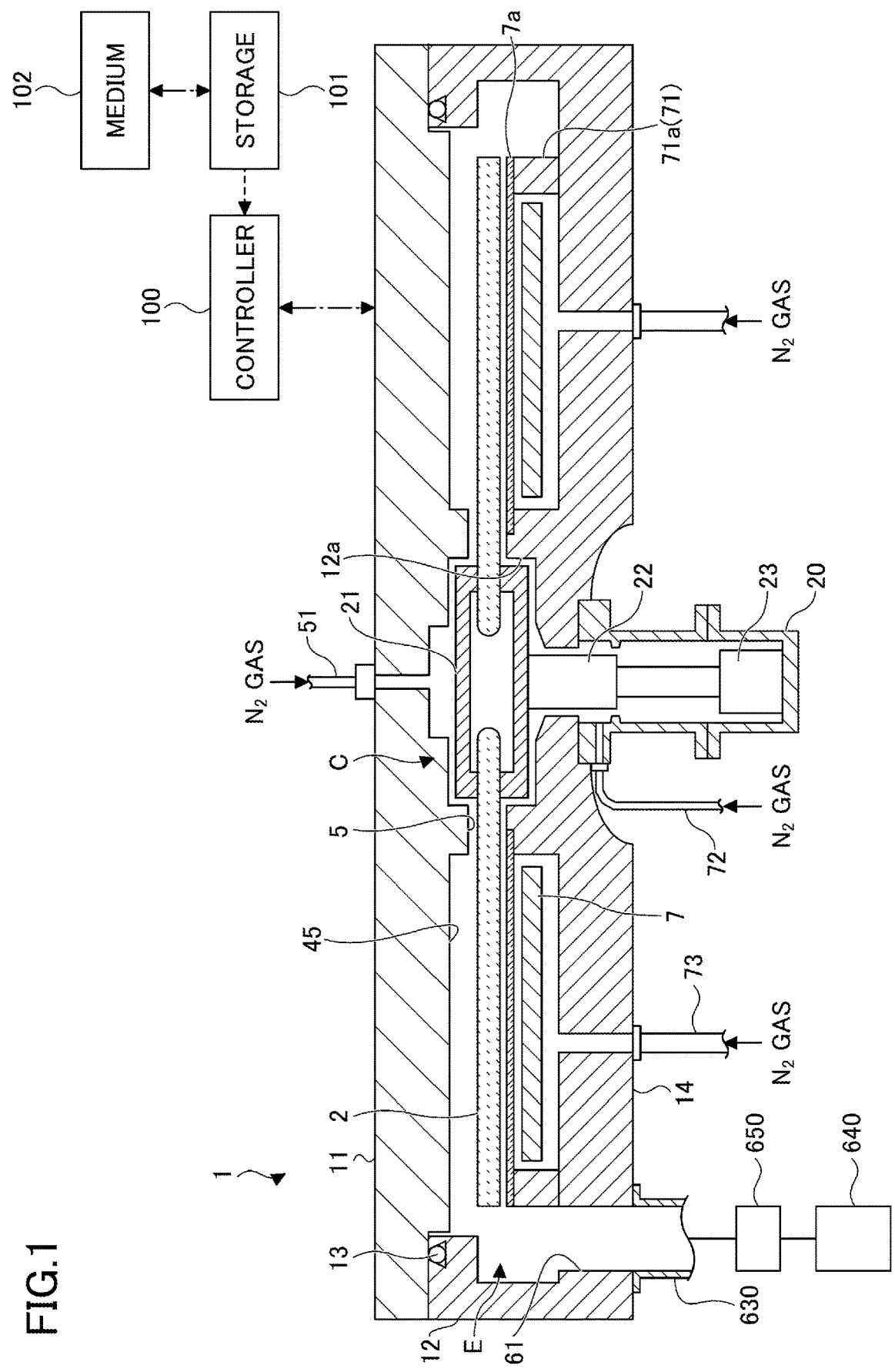
FIG. 1 is a schematic cross sectional view illustrating a film forming apparatus according to one embodiment.

A description will hereinafter be given of non-limiting embodiments of the present disclosure with reference to the drawings. In the drawings, identical or corresponding constituent elements, such as members, components, or the like, are designated by the same or corresponding reference numerals, and a redundant description thereof will be omitted.

The present disclosure provides a technique capable of minimizing an overhang.

[Film Forming Apparatus]

A film forming apparatus (or film deposition apparatus) suitable for performing a film forming method (or film deposition method) according to one embodiment will be described. The film forming method according to one embodiment can be performed by various types of film forming apparatuses, and the usable type of the film forming apparatus is not particularly limited, as long as a kind of gas supplied to a substrate can be switched at a high speed. An example of the film forming apparatus, capable of performing such a high-speed switching of the kind of gas supplied to the substrate, will be described hereinafter.

Figure 2:
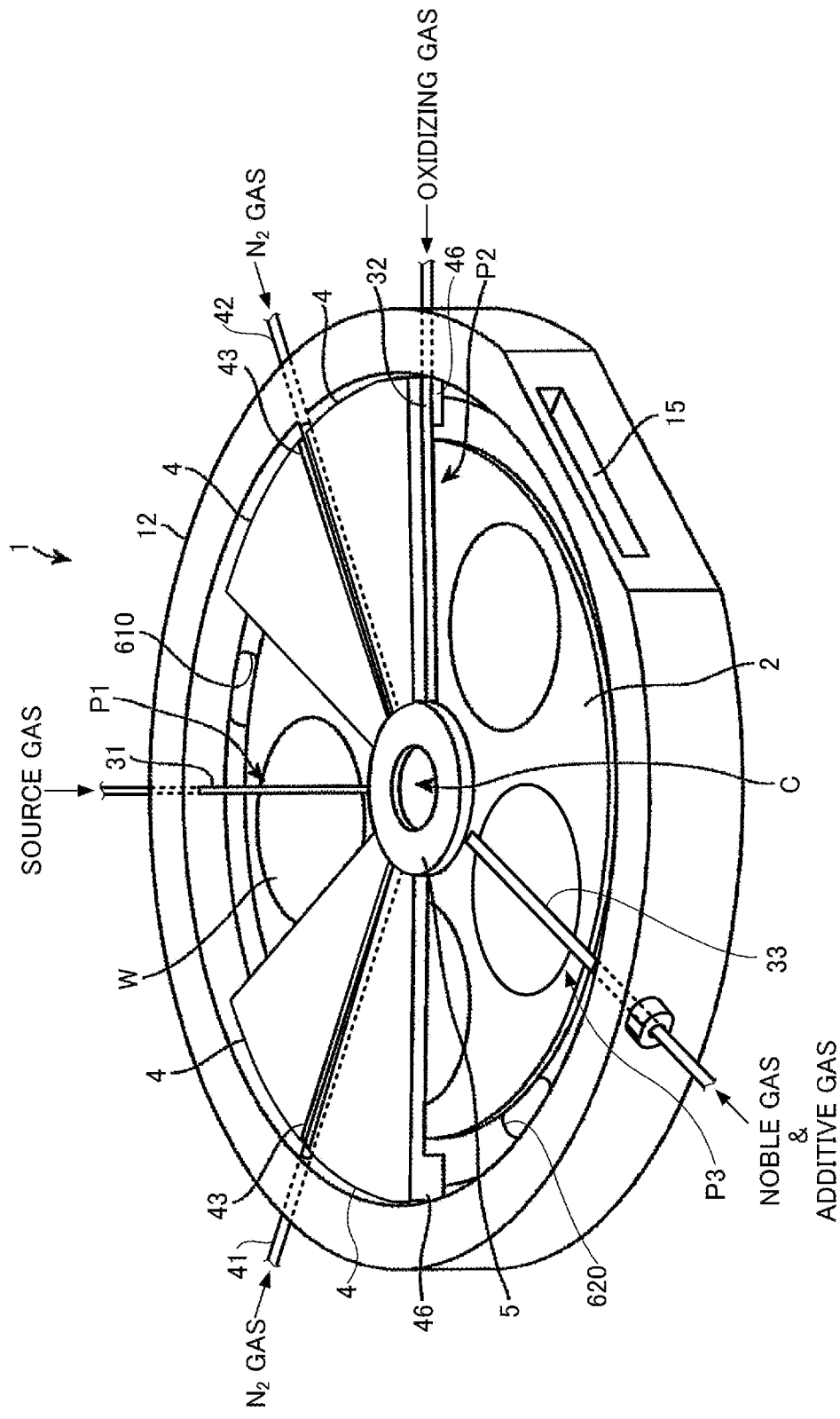
FIG. 2 is a schematic perspective view illustrating a configuration inside a vacuum chamber of the film forming apparatus of FIG. 1.
Figure 3:
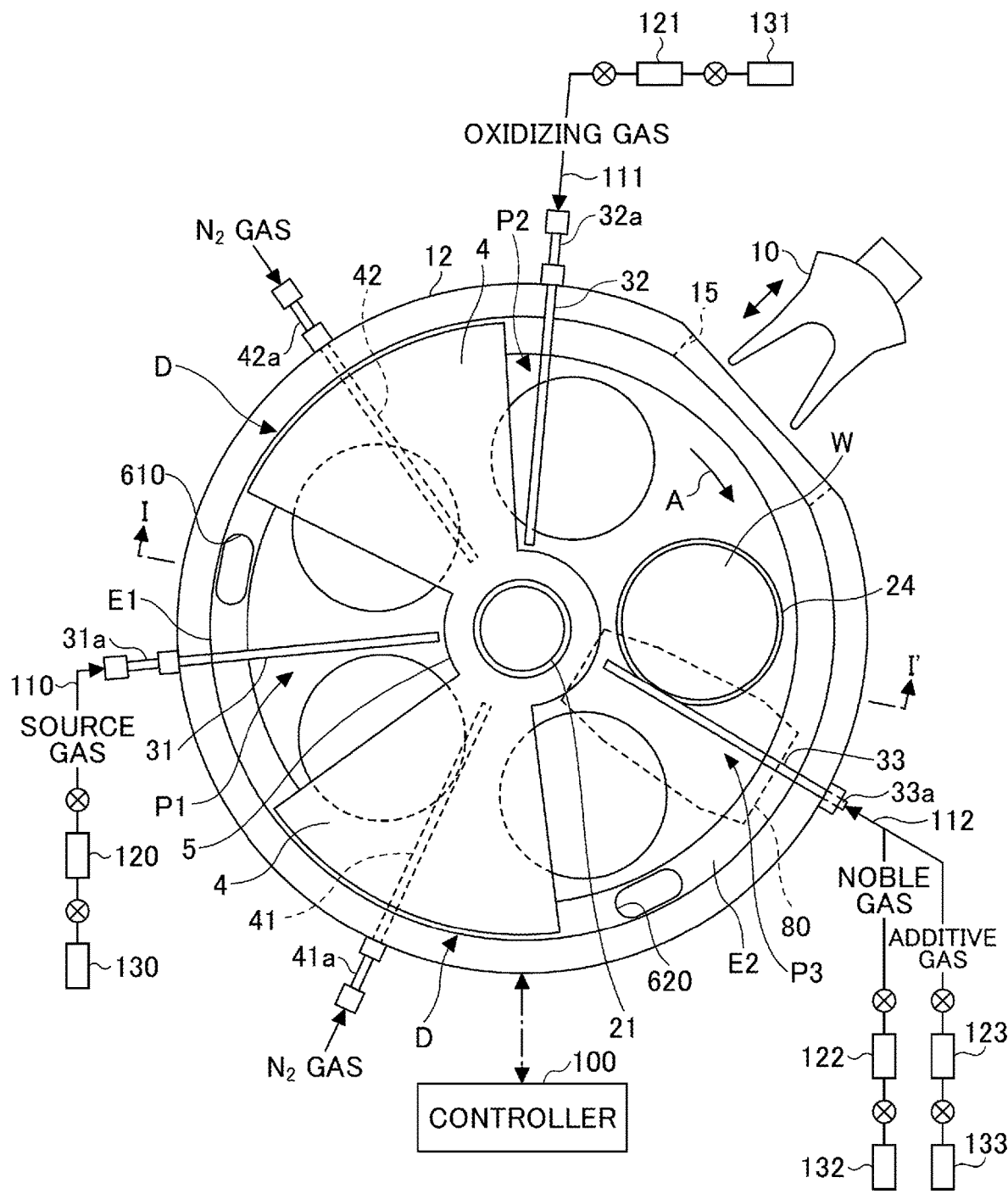
FIG. 3 is a schematic plan view illustrating the configuration inside the vacuum chamber of the film forming apparatus of FIG. 1.

As illustrated in FIG. 1 through FIG. 3, the film forming apparatus includes a flat vacuum chamber 1 having an approximately circular planar shape, and a turntable 2, provided inside the vacuum chamber 1, and having a rotation center located at a center of the vacuum chamber 1. The vacuum chamber 1 is a processing chamber in which a film forming process is performed on a surface of a substrate W accommodated therein. The substrate W is a semiconductor wafer, for example. The vacuum chamber 1 includes a chamber body 12 having a cylindrical shape with a bottom, and a top plate 11 airtightly and detachably disposed on an upper surface of the chamber body 12 via a seal member 13 illustrated in FIG. 1, such as an O-ring or the like, for example.

A central portion of the turntable 2 is fixed to a cylindrical core part 21. The core part 21 is fixed to an upper end of a rotating shaft 22 that extends in a vertical direction. The rotating shaft 22 penetrates a bottom part 14 of the vacuum chamber 1, and a lower end of the rotating shaft 22 is attached to a driving part 23 that rotates the rotating shaft 22 illustrated in FIG. 1 around a vertical axis. The rotating shaft 22 and the driving part 23 are accommodated inside a cylindrical case body 20 having an opening at an upper surface thereof. A flange, provided on the upper surface of the case body 20, is airtightly attached to a lower surface of the bottom part 14 of the vacuum chamber 1, thereby maintaining an airtight state between an internal atmosphere of the case body 20 and an external atmosphere of the case body 20.

As illustrated in FIG. 2 and FIG. 3, a plurality of (five in the illustrated example) circular recesses 24, configured to receive the substrates W placed therein, are provided in an upper surface of the turntable 2 along a rotation direction (or circumferential direction). In FIG. 3, the substrate W is illustrated in only one recess 24 for the sake of convenience. The recess 24 has an inside diameter that is slightly larger, that is, for example 4 mm larger, than a diameter of the substrate W, and a depth that is approximately equal to a thickness of the substrate W. For this reason, when the substrate W is accommodated in the recess 24, the upper surface of the accommodated substrate W and an upper surface portion of the turntable 2 (a region of the turntable 2 where the substrate W is not placed) coincide and are located at the same height. Through holes (not illustrated) are formed in a bottom surface of the recess 24, and for example, three raising and lowering pins for supporting a lower surface of the substrate W to raise and lower the substrate W with respect to the recess 24, penetrate the through holes.

FIG. 2 and FIG. 3 are diagrams for explaining a structure inside the vacuum chamber 1, and the illustration of the top plate 11 is omitted in FIG. 2 and FIG. 3 for the sake of convenience. As illustrated in FIG. 2 and FIG. 3, a source gas nozzle 31, a reactive gas nozzle 32, a reforming gas nozzle 33, and separation gas nozzles 41 and 42 are disposed above the turntable 2, at intervals in the circumferential direction of the vacuum chamber 1 (that is, the rotation direction of the turntable 2 indicated by an arrow A in FIG. 3). In the illustrated example, the separation gas nozzle 41, the source gas nozzle 31, the separation gas nozzle 42, the reactive gas nozzle 32, and the reforming gas nozzle 33 are arranged in this order along the rotation direction of the turntable 2. The nozzles 31, 32, 33, 41, and 42 are made formed of quartz, for example. Gas inlet ports 31a, 32a, 33a, 41a, and 42a illustrated in FIG. 3, located at base ends of the nozzles 31, 32, 33, 41, and 42, respectively, are fixed to an outer peripheral wall of the chamber body 12. Accordingly, each of the nozzles 31, 32, 33, 41, and 42 is introduced into the vacuum chamber 1 from the outer peripheral wall of the vacuum chamber 1, and is mounted so as to extend horizontally with respect to the turntable 2 along a radial direction of the chamber body 12.

Figure 4:
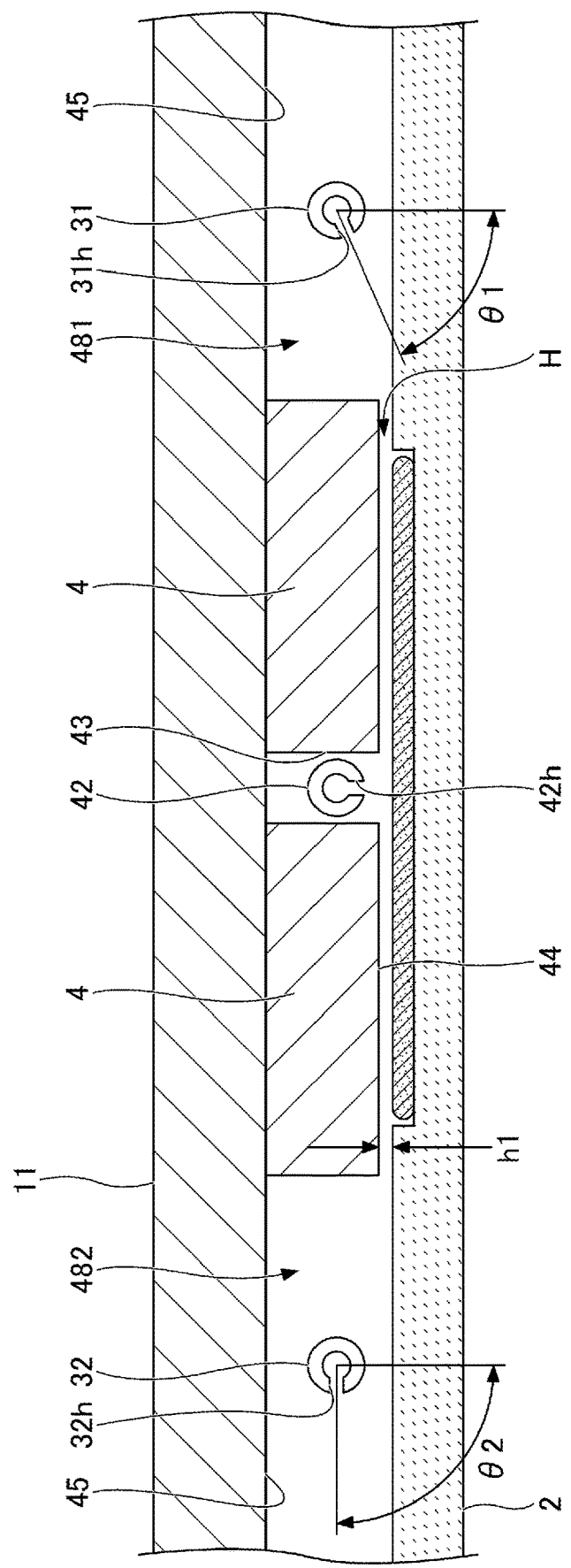
FIG. 4 is a schematic cross sectional view of the vacuum chamber taken along a concentric circle of a turntable of the film forming apparatus of FIG. 1.

The source gas nozzle 31 is an example of a source gas supply. The source gas nozzle 31 is connected to a source gas supply source 130 via a pipe 110, a flow rate controller 120, or the like. In the source gas nozzle 31, a plurality of discharge holes 31h illustrated in FIG. 4 are arranged at desired intervals along a longitudinal direction of the source gas nozzle 31. The desired intervals may be 10 mm, for example. A region below the source gas nozzle 31 serves as an adsorption region P1 where the source gas is adsorbed.

Each discharge hole 31h opens at a first angle $\theta 1$ toward a downstream side in the rotation direction of the turntable 2, with respect to a vertically downward direction, for example. The source gas nozzle 31 supplies the source gas from each discharge hole 31h at the first angle $\theta 1$ with respect to the vertically downward direction. In this case, when forming a film on the upper surface of the substrate W having a convex portion, the source gas supplied from each discharge hole 31h can easily reach an upper portion of the convex portion but have difficulty reaching a lower portion of the convex portion. For this reason, an adsorption amount of the source gas is larger at the upper portion than at the lower portion of the convex portion. In addition, the source gas supplied from each discharge hole 31h is more likely adsorbed on the upper surface of the convex portion than on a side surface of the convex portion.

The first angle $\theta 1$ is an angle other than 0°. The first angle $\theta 1$ is preferably in a range greater than or equal to 60° and less than or equal to 80°, and is 70°, for example. Each discharge hole 31h may open at the first angle $\theta 1$ toward the upstream side in the rotation direction of the turntable 2 with respect to the vertically downward direction.

The source gas is an organic metal gas or an organic semimetal gas, for example. The organic metal gas may be an organic metal gas used for forming a high dielectric constant (high-k) film, for example. The organic metal gas may be a gas including various kinds of organic metals, and when forming a titanium oxide ($TiO_2$) film, for example, the gas may include an organic amino titanium, such as tetrakis (dimethylamino) titanium (TDMAT) gas or the like. The organic semimetal gas may be an organosilane gas, for example. The organosilane gas may be an organoaminosilane gas, such as 3DMAS or the like, for example.

The reactive gas nozzle 32 is an example of a reactive gas supply. The reactive gas nozzle 32 is connected to an oxidizing gas supply source 131 via a pipe 111, a flow rate controller 121, or the like. In the reactive gas nozzle 32, a plurality of discharge holes 32h illustrated in FIG. 4 are arranged at desired intervals along a longitudinal direction of the reactive gas nozzle 32. The desired intervals may be 10 mm, for example. A region below the reactive gas nozzle 32 serves as an oxidation region P2 where an oxidizing gas for oxidizing the source gas adsorbed on the substrate W in the adsorption region P1 is supplied, and a molecular layer of an oxide of the organic metal or the organic semimetal included in the source gas is generated as a reaction product by thermal oxidation. The oxidation region P2 is an example of a reaction region.

Figure 9:
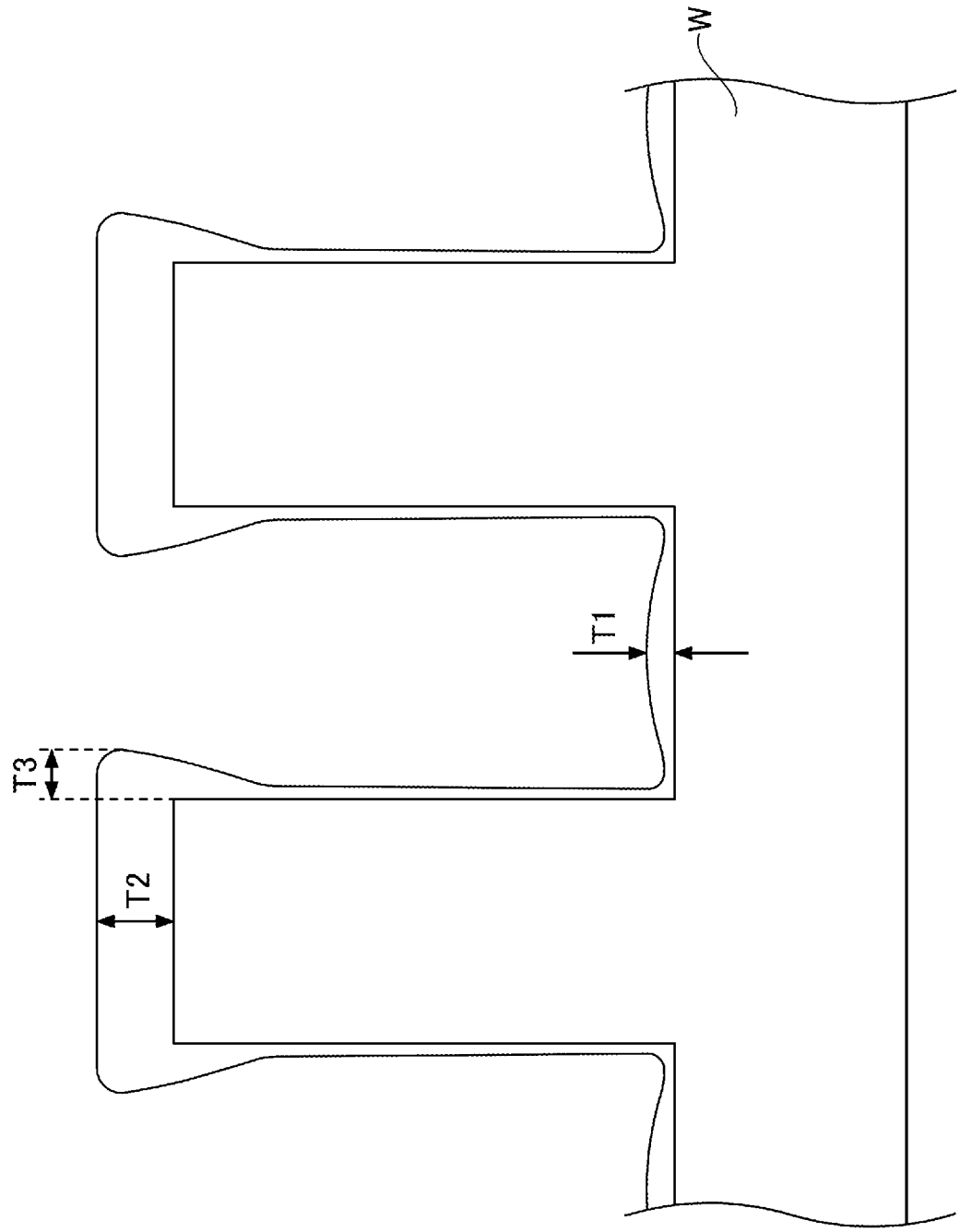
FIG. 9 is a diagram for explaining a film formed on a surface of a substrate.

Each discharge hole 32h opens at a second angle $\theta 2$ toward the downstream side in the rotation direction of the turntable 2, with respect to the vertically downward direction, for example. The reactive gas nozzle 32 supplies the oxidizing gas from each discharge hole 32h at the second angle $\theta 2$ with respect to the vertically downward direction. In this case, when forming a film on the upper surface of the substrate W having a convex portion, the oxidizing gas supplied from each discharge hole 32h can easily reach an upper portion of the convex portion but have difficulty reaching a lower portion of the convex portion. For this reason, as illustrated in FIG. 9, a thickness T2 of the film formed on the upper portion of the convex portion, such as an upper surface of the convex portion, for example, and a thickness T3 of the film formed on an upper portion of a side surface of the convex portion, become greater than a thicknesses T1 of the film formed on a lower portion of the convex portion, such as a bottom surface between two mutually adjacent convex portions, for example. Hence, a film having a helmet shape, covering the upper surface of the convex portion and the upper portion of the side surface of the convex portion, can be formed. In addition, the oxidizing gas supplied from each discharge hole 32h more likely reacts with the source gas on the upper surface of the convex portion than on the side surface of the convex portion. Thus, as illustrated in FIG. 9, the thickness T2 of the film formed on the upper surface of the convex portion tends to be greater than the thickness T3 of the film formed on the side surface of the convex portion. As a result, it is possible to form a film having the helmet shape with minimized overhang (or low overhang). As illustrated in FIG. 9, the overhang is represented by a ratio T3/T2 between the thickness T3 of the film formed on the side surface of the convex portion and the thickness T2 of the film formed on the upper surface of the convex portion.

The second angle θ2 is an angle other than 0°. The second angle θ2 is preferably in a range greater than or equal to 80° and less than or equal to 100°, and is 90°, for example. In a case where the second angle θ2 is 90°, the reactive gas nozzle 32 supplies the oxidizing gas from each discharge hole 32h in a direction parallel to the upper surface of the turntable 2. Each discharge hole 32h may open at the second angle θ2 toward an upstream side in the rotation direction of the turntable 2 with respect to the vertically downward direction.

Various kinds of oxidizing gases may be used for the oxidizing gas, as long as the oxidizing gas reacts with the supplied organic metal gas to generate an organic metal oxide. When oxidizing the organic metal gas by thermal oxidation, for example, water vapor ($H_2O$), hydrogen peroxide ($H_2O_2$) gas, oxygen ($O_2$) gas, ozone ($O_3$) gas, or the like is selected as the oxidizing gas.

The reactive gas nozzle 32 may be connected to a nitriding gas supply source. In this case, a region below the reactive gas nozzle 32 serves as a nitridation region where a nitriding gas for nitriding the source gas adsorbed on the substrate W in the adsorption region P1 is supplied, and a molecular layer of a nitride of the organic metal or the organic semimetal included in the source gas is generated as a reaction product by thermal oxidation. The nitridation region is an example of the reaction region. Various kinds of nitriding gases may be used for the nitriding gas, as long as the nitriding gas reacts with the supplied organic metal gas to generate an organic metal nitride. When nitriding the organic metal gas by thermal nitridation, for example, ammonia ($NH_3$) gas is selected as the nitriding gas.

The reforming gas nozzle 33 is connected to a noble gas supply source 132 and an additive gas supply source 133 via a pipe 112, a flow rate controller 122, or the like. A region below the reforming gas nozzle 33 serves as a reforming region P3 where a noble gas and an additive gas are plasmatized (that is, formed into plasma) and supplied to the organic metal oxide or the organic semimetal oxide (or protective film) generated by the thermal oxidation in the oxidation region P2 to perform a plasma process (or reforming process). An argon (Ar) gas, a helium (He) gas, or the like suitable for the plasmatization is selected as the noble gas. An oxygen ($O_2$) gas, a hydrogen ($H_2$) gas, or the like is selected as the additive gas.

The reforming region P3 may be omitted. The reforming process using the plasma may be performed arbitrarily, and the film forming apparatus may be configured to perform only thermal reaction (thermal oxidation or thermal nitridation) in the oxidation region P2 or the nitridation region. In this case, the plasma generator 80 and the reforming gas nozzle 33 may be omitted. In a case where the reforming region P3 is provided, the plasma generator 80 and the reforming gas nozzle 33 are also provided. In FIG. 3, the plasma generator 80 is illustrated in a simplified manner in broken lines. Details of the reforming gas nozzle 33 and the plasma generator 80 will be described later.

Each of the separation gas nozzles 41 and 42 is connected to a separation gas supply source (not illustrated) via a pipe (not illustrated), a flow rate controller (not illustrated), or the like. For example, nitrogen ($N_2$) gas is used as the separation gas. A noble gas, such as a helium gas, an argon gas, or the like, may be used for the separation gas.

Although one source gas nozzle 31 is provided in the illustrated example, two or more source gas nozzles 31 may be provided at intervals in the rotation direction of the turntable 2, for example.

As illustrated in FIG. 2 and FIG. 3, two projecting parts 4 are provided inside the vacuum chamber 1. The projecting parts 4 form separation regions D together with the separation gas nozzles 41 and 42. For this reason, as will be described later, the projecting parts 4 are attached to a lower surface (or back surface) of the top plate 11, so as to project toward the turntable 2. The projecting part 4 has a planar shape that is a fan shape with a tip portion thereof cut in an arcuate shape. The projecting part 4 is disposed so that an inner arc thereof is connected to a protruding hub 5 which will be described later, and an outer arc thereof extends along an inner peripheral surface of the chamber body 12 of the vacuum chamber 1.

FIG. 4 illustrates a cross section of the vacuum chamber 1 taken along a concentric circle of the turntable 2, from the source gas nozzle 31 to the reactive gas nozzle 32. As illustrated in FIG. 4, the projecting part 4 is attached to the lower surface of the top plate 11. For this reason, a first ceiling surface 44 and second ceiling surfaces 45 are provided inside the vacuum chamber 1. The first ceiling surface 44 is formed by a flat lower surface of the projecting part 4. The second ceiling surfaces 45 are located on both sides of the first ceiling surface 44 in the circumferential direction, respectively, and are higher than the first ceiling surface 44. The first ceiling surface 44 has a planar shape that is a fan shape with a tip portion thereof cut in an arcuate shape. As illustrated in FIG. 4, a groove 43 formed in the projecting part 4 so as to extend in a radial direction, at a center along the circumferential direction of the projecting part 4. The separation gas nozzle 42 is accommodated in the groove 43. Similarly, a groove 43 is formed in the other projecting part 4, and the separation gas nozzle 41 is accommodated in this groove 43. The source gas nozzle 31 and the reactive gas nozzle 32 are provided in spaces below the second ceiling surfaces 45, respectively. The source gas nozzle 31 and the reactive gas nozzle 32 are spaced apart from the second ceiling surfaces 45, and are provided in a vicinity of the substrate W. As illustrated in FIG. 4, the source gas nozzle 31 is provided in a right space 481 below the right second ceiling surface 45, and the reactive gas nozzle 32 is provided in a left space 482 below the left second ceiling surface 45.

In the separation gas nozzle 42, a plurality of discharge holes 42*h* illustrated in FIG. 4, that open toward the turntable 2, are arranged at desired intervals along the longitudinal direction of the separation gas nozzle 42. The desired intervals may be 10 mm, for example. Similar to the separation gas nozzle 42, a plurality of discharge holes (not illustrated), that open toward the turntable 2, are arranged in the separation gas nozzle 41 at desired intervals along the longitudinal direction of the separation gas nozzle 41. The desired intervals may be 10 mm, for example.

The first ceiling surface 44 forms a separation space H, which is a narrow space, with respect to the turntable 2. When the nitrogen gas is supplied from the discharge holes 42*h* of the separation gas nozzle 42, the nitrogen gas flows toward the space 481 and the space 482 through the separation space H. In this state, because a volume of the separation space H is smaller than volumes of the spaces 481 and 482, a pressure of the separation space H can be made higher than pressures of the spaces 481 and 482 by the nitrogen gas. That is, the separation space H having a high pressure is formed between the spaces 481 and 482. The nitrogen flowing out from the separation space H into the spaces 481 and 482 acts as a counter flow with respect to the source gas from the adsorption region P1 and the oxidizing gas from the oxidation region P2. For this reason, the source gas from the adsorption region P1 and the oxidizing gas from the oxidation region P2 are separated by the separation space H. Hence, the source gas and the oxidizing gas are prevented from mixing and reacting with each other inside the vacuum chamber 1.

A height h1 of the first ceiling surface 44 with respect to the upper surface of the turntable 2 is set to a height suitable for making the pressure in the separation space H higher than the pressures in the spaces 481 and 482, by taking into consideration a pressure inside the vacuum chamber 1 during the film forming process, the rotation speed of the turntable 2, an amount of the separation gas (nitrogen gas) supplied, or the like.

The protruding hub 5 illustrated in FIG. 2 and FIG. 3, surrounding an outer periphery of the core part 21 to which the turntable 2 is fixed, is provided on the lower surface of the top plate 11. The protruding hub 5 is continuous with the portions of the projecting parts 4 closer to the rotation centers thereof, and a lower surface of the protruding hub 5 is formed to the same height as the first ceiling surface 44. That is, the lower surface of the protruding hub 5 coincides with the first ceiling surface 44.

Figure 5:
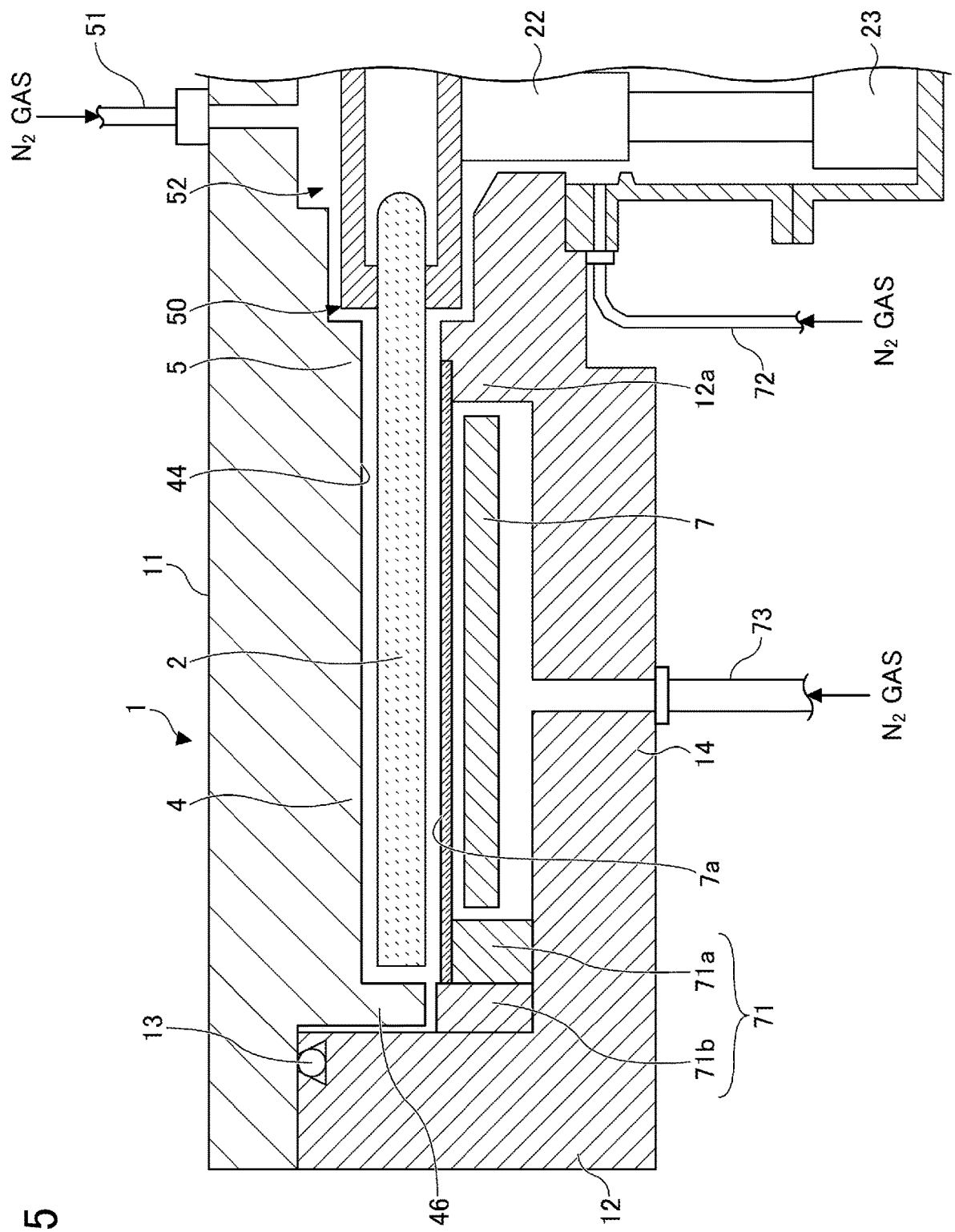
FIG. 5 is another schematic cross sectional view of the film forming apparatus of FIG. 1.

FIG. 1 referred to above is a cross sectional view taken along a line I-I' in FIG. 3, and illustrates a region where the second ceiling surface 45 is provided. On the other hand, FIG. 5 is a cross sectional view illustrating a region where the first ceiling surface 44 is provided. As illustrated in FIG. 5, a bent part 46, that is bent in an L-shape so as to face an outer end surface of the turntable 2, is formed at a peripheral edge portion of the fan-shaped projecting part 4 (a portion on the outer edge of the vacuum chamber 1). Similar to the projecting part 4, the bent part 46 prevents the reactive gases from entering from both sides of the separation region D, and prevents mixing of the two reactive gases. Because the projecting part 4 is provided on the top plate 11, and the top plate 11 is removable from the chamber body 12, there is a slight gap between an outer peripheral surface of the bent part 46 and the chamber body 12. A gap between an inner peripheral surface of the bent part 46 and the outer end surface of the turntable 2, and the gap between the outer peripheral surface of the bent part 46 and the chamber body 12, are set to the same dimension as the height of the first ceiling surface 44 with respect to the upper surface of the turntable 2, for example.

As illustrated in FIG. 4, in the separation region D, the inner peripheral wall of the chamber body 12 is formed to a vertical surface close to the outer peripheral surface of the bent part 46. As illustrated in FIG. 1, the inner peripheral wall of the chamber body 12 is recessed outward from a portion facing the outer end surface of the turntable 2 to the bottom part 14, at a portion other than the separation region D. Hereinafter, for the sake of convenience of description, the recessed portion having an approximately rectangular cross sectional shape will also be referred to as an exhaust region. More particularly, an exhaust region communicating with the adsorption region P1 is referred to as a first exhaust region E1, and a region communicating with the oxidation region P2 and the reforming region P3 is referred to as a second exhaust region E2. As illustrated in FIG. 1 through FIG. 3, a first exhaust port 610 and a second exhaust port 620 are formed at bottom parts of the first exhaust region E1 and the second exhaust region E2, respectively. As illustrated in FIG. 1, the first exhaust port 610 and the second exhaust port 620 are connected to a vacuum pump 640, which is a vacuum exhaust means, for example, via an exhaust pipes 630. A pressure controller 650 is provided between the vacuum pump 640 and the exhaust pipe 630.

As illustrated in FIG. 1 and FIG. 4, a heater unit 7 is provided in a space between the turntable 2 and the bottom part 14 of the vacuum chamber 1. The heater unit 7 heats the substrate W on the turntable 2, via the turntable 2, to a temperature (for example, 150° C.) determined by a process recipe. A ring-shaped cover member 71 is provided under the turntable 2, in a vicinity of the peripheral edge of the turntable 2, as illustrated in FIG. 5. Accordingly, an atmosphere from the space above the turntable 2 to the exhaust regions E1 and E2, and an atmosphere in which the heater unit 7 is provided, are partitioned from each other, thereby preventing the gas from entering the region under the turntable 2. The cover member 71 includes an inner member 71*a* provided to face the outer edge portion of the turntable 2 and an outer peripheral side of the outer edge portion from under the turntable 2, and an outer member 71*b* provided between the inner member 71*a* and the internal wall surface of the vacuum chamber 1. The outer member 71*b* is provided under the bent part 46 formed at the outer edge portion of the projecting part 4 in the separation region D, in a close proximity to the bent part 46. The inner member 71*a* surrounds the entire circumference of the heater unit 7 under the outer edge portion of the turntable 2 (and under a portion slightly outside the outer edge portion).

The bottom part 14, at a portion closer to the rotation center than the space in which the heater unit 7 is disposed, includes a protruding portion 12*a* that protrudes upward so as to approach the core part 21 in a vicinity of a central portion of the lower surface of the turntable 2. A narrow space is formed between the protruding portion 12*a* and the core part 21, and a narrow space (or gap) is formed between the inner peripheral surface of the through hole penetrating the bottom part 14 and the rotating shaft 22 inserted into the through hole. These narrow spaces communicate with the case body 20. The case body 20 is provided with a purge gas supply pipe 72 that supplies a nitrogen gas as the purge gas, into the narrow spaces to purge the narrow spaces. A plurality of purge gas supply pipes 73, that supply the nitrogen gas as the purge gas, to a space in which the heater unit 7 is arranged to purge this space, are provided on the bottom part 14 of the vacuum chamber 1 under the heater unit 7 at desired angular intervals in the circumferential direction. One purge gas supply pipe 73 is illustrated in FIG. 5. A lid member 7a, that covers a region between the inner peripheral wall of the outer member 71b (the upper surface of the inner member 71a) and an upper end of the protruding portion 12a in the circumferential direction, is disposed between the heater unit 7 and the turntable 2, in order to prevent the gas from entering the region in which the heater unit 7 is arranged. The lid member 7a is made of quartz, for example.

A separation gas supply pipe 51 is connected to a central portion of the top plate 11 of the vacuum chamber 1. The separation gas supply pipe 51 supplies the nitrogen gas as the separation gas, to a space 52 between the top plate 11 and the core part 21. The separation gas supplied to the space 52 is discharged toward the peripheral edge of the turntable 2 along the surface of the turntable 2 on the same side as a substrate placing region where the substrate W is placed, through a narrow space 50 between the protruding hub 5 and the turntable 2. The space 50 can be maintained at a pressure higher than the pressures in the spaces 481 and 482 by the separation gas. For this reason, the space 50 prevents the organic metal gas supplied to the adsorption region P1 and the oxidizing gas supplied to the oxidation region P2 from passing through a central region C and mixing with each other. That is, the space 50 (or the central region C) functions similarly to the separation space H (or the separation region D).

As illustrated in FIG. 2 and FIG. 3, a transport port 15, that is used to transport the substrate W between an external transport arm 10 and the turntable 2, is formed in a sidewall of the vacuum chamber 1. The transport port 15 is opened and closed by a gate valve (not illustrated). The substrate W is transported between the recess 24, that is the substrate placing region of the turntable 2, and the transport arm 10, at a position facing the transport port 15. For this reason, the raising and lowering pins (not illustrated) that penetrate the recess 24 and support the lower surface of the substrate W to raise and lower the substrate W, and a raising and lowering mechanism (not illustrated) that raise and lower the raising and lowering pins, are provided at a portion corresponding to the transport position under the turntable 2.

Figure 6:
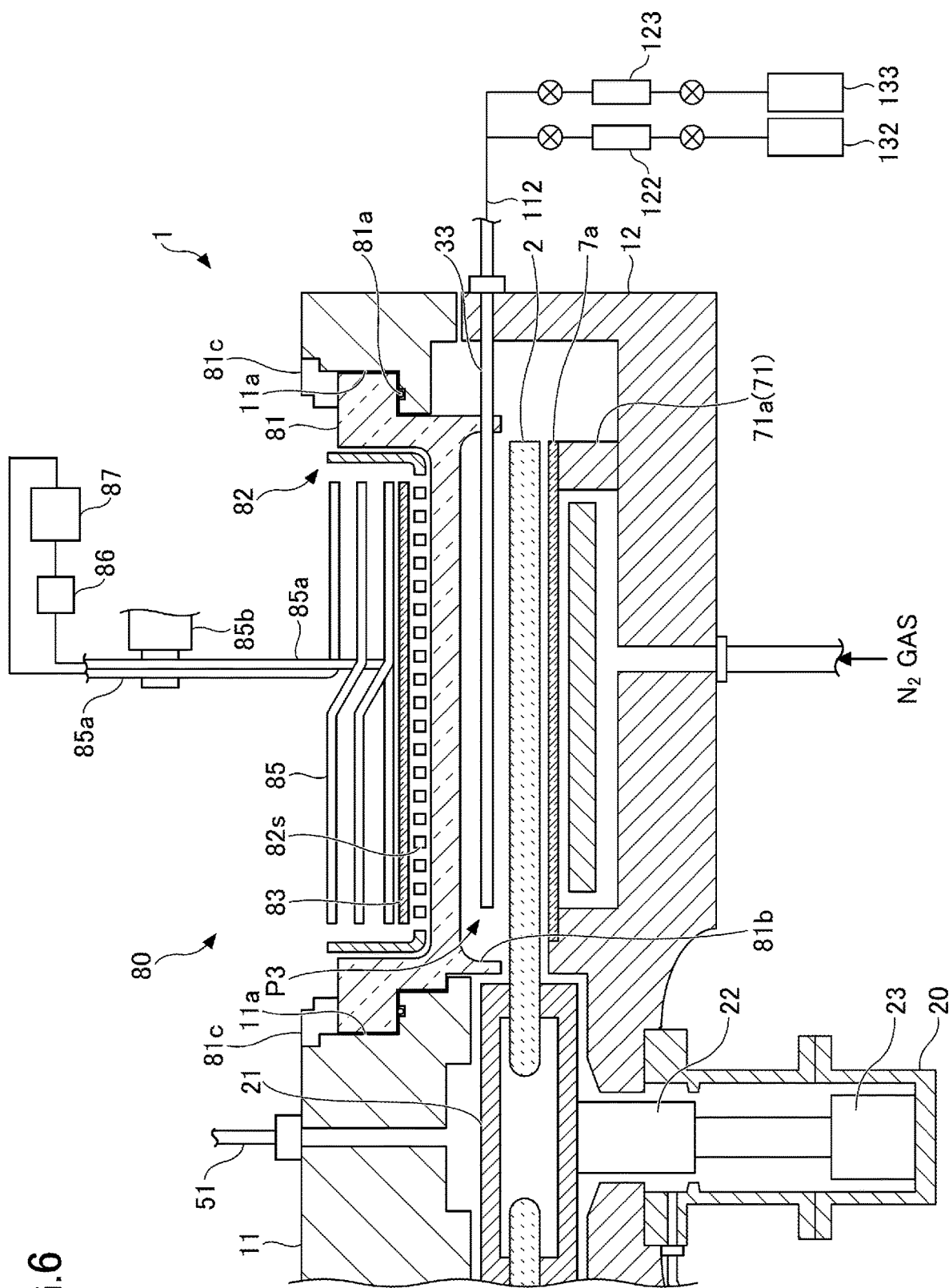
FIG. 6 is a schematic cross sectional view illustrating a plasma generator.
Figure 7:
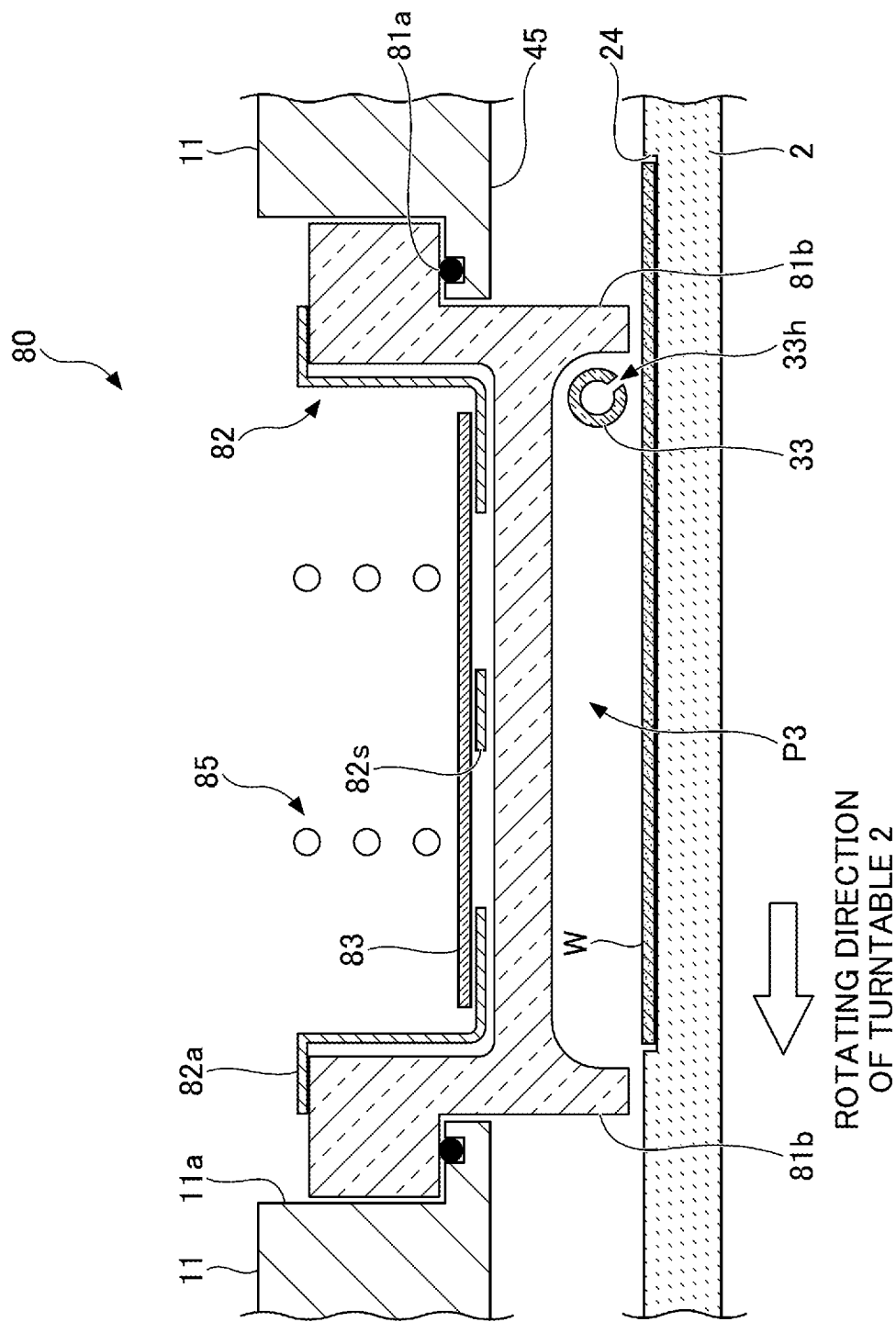
FIG. 7 is another schematic cross sectional view illustrating the plasma generator.
Figure 8:
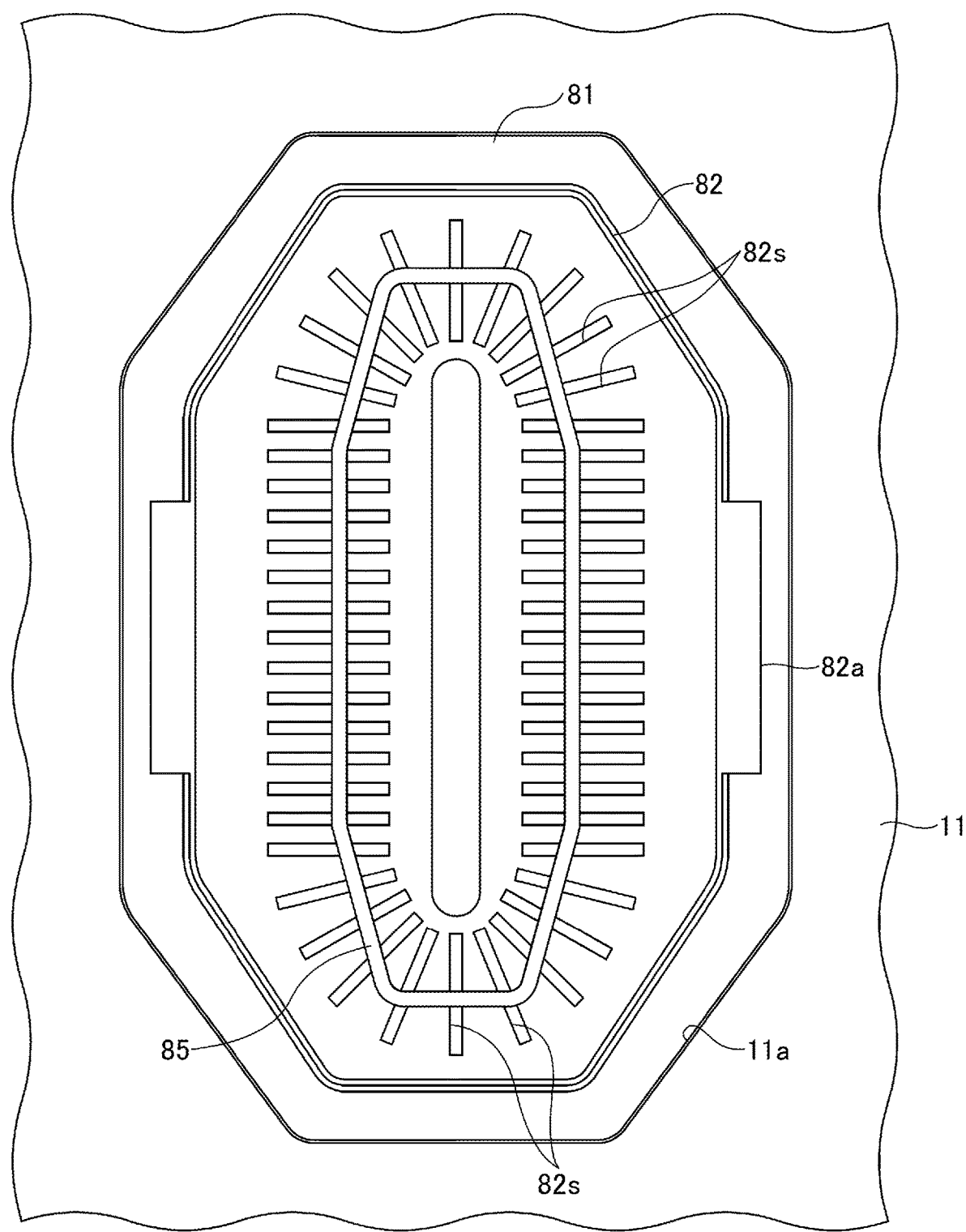
FIG. 8 is a schematic top view of the plasma generator.

Next, the plasma generator 80 will be described with reference to FIG. 6 through FIG. 8. FIG. 6 is a schematic cross sectional view of the plasma generator 80 taken along the radial direction of the turntable 2, FIG. 7 is a schematic cross sectional view of the plasma generator 80 taken along a direction perpendicular to the radial direction of the turntable 2, and FIG. 8 is a schematic top view illustrating the plasma generator 80. For the sake of convenience of illustration, some members are illustrated in a simplified manner.

As illustrated in FIG. 6, the plasma generator 80 includes a frame member 81, a Faraday shield plate 82, an insulating plate 83, and an antenna 85.

The frame member 81 is made of a high-frequency permeable material. The frame member 81 has a recess that is recessed from an upper surface thereof. The frame member 81 is fitted into an opening 11a formed in the top plate 11. The Faraday shield plate 82 is accommodated in the recess of the frame member 81. The Faraday shield plate 82 has an approximately box shape with an open upper portion. The insulating plate 83 is disposed on a bottom surface of the Faraday shield plate 82. The antenna 85 is supported above the insulating plate 83. The antenna 85 has a planar coil shape that is an approximately octagonal shape.

The opening 11a of the top plate 11 has a plurality of stepped portions. A groove is formed for the entire circumference of one stepped portion among the plurality of stepped portions, and a seal member 81a, such as an O-ring or the like, for example, is fitted into this groove. The frame member 81 has a plurality of stepped portions corresponding to the plurality of stepped portions of the opening 11a. When the frame member 81 is fitted into the opening 11a, a back surface of one stepped portion among the plurality of stepped portions of the frame member 81 makes contact with the seal member 81a that is fitted into the groove of the opening 11a. Accordingly, airtightness between the top plate 11 and the frame member 81 can be maintained. As illustrated in FIG. 6, a pressing member 81c is provided along an outer periphery of the frame member 81 that is fitted into the opening 11a of the top plate 11. Thus, the frame member 81 is pressed downward against the top plate 11. For this reason, the airtightness between the top plate 11 and the frame member 81 can be maintained more reliably.

A lower surface of the frame member 81 faces the turntable 2 inside the vacuum chamber 1, and a protrusion 81b protruding downward (toward the turntable 2) is provided on the entire outer periphery of the lower surface of the frame member 81. A lower surface of the protrusion 81b is close to the upper surface of the turntable 2, and a space (hereinafter also referred to as the reforming region P3) is defined above the turntable 2 by the protrusion 81b, the upper surface of the turntable 2, and the lower surface of the frame member 81. A distance between the lower surface of the protrusion 81b and the upper surface of the turntable 2 may be approximately equal to the height h1 of the first ceiling surface 44 with respect to the upper surface of the turntable 2 in the separation space H (refer to FIG. 4).

The reforming gas nozzle 33, that penetrates the protrusion 81b, extends to the reforming region P3. As illustrated in FIG. 6, the noble gas supply source 132 filled with a noble gas, such as the argon gas, the helium gas, or the like, is connected to the reforming gas nozzle 33 by the pipe 112 via the flow rate controller 122. As illustrated in FIG. 6, the additive gas supply source 133 filled with the additive gas such as the oxygen gas, the hydrogen gas, or the like, is connected to the reforming gas nozzle 33 by the pipe 112 via the flow rate controller 123. That is, the noble gas having the flow rate thereof controlled by the flow rate controller 122, and the additive gas having the flow rate thereof controlled by the flow rate controller 123, are mixed at a desired flow rate, and a mixture gas is plasmatized (that is, formed into plasma) by the plasma generator 80 and supplied to the reforming region P3.

In the reforming gas nozzle 33, a plurality of discharge holes 33h are arranged at desired intervals along a longitudinal direction of the reforming gas nozzle 33. The desired intervals may be 10 mm, for example. The reforming gas nozzle 33 discharges the mixture gas described above from the discharge holes 33h. As illustrated in FIG. 7, the discharge holes 33h are inclined from the direction perpendicular with respect to the turntable 2 toward the upstream side in the rotation direction of the turntable 2. For this reason, the gas supplied from the reforming gas nozzle 33 is discharged in a direction opposite to the rotation direction of the turntable 2, that is, toward the space between the lower surface of the protrusion 81b and the upper surface of the turntable 2. Thus, the reactive gas and the separation gas are prevented from flowing into the reforming region P3 from the space under the second ceiling surface 45 located on the upstream side of the plasma generator 80 along the rotation direction of the turntable 2. In addition, as described above, because the protrusion 81b formed along the outer periphery of the lower surface of the frame member 81 is close to the upper surface of the turntable 2, the pressure in the reforming regions P3 can easily be maintained high by the gas from the reforming gas nozzle 33. This configuration also prevents the reactive gas and the separation gas from flowing into the reforming region P3.

Accordingly, the frame member 81 serves to separate the reforming region P3 from the oxidation region P2. Hence, the film forming apparatus according to one embodiment does not necessarily include the entire plasma generator 80, but includes the frame member 81 in order to partition the reforming region P3 from the oxidation region P2 and prevent mixing of the oxidizing gas.

The Faraday shield plate 82 is made of a conductive material, such as a metal or the like, and is grounded although the grounding arrangement is not illustrated. As illustrated in FIG. 8, a plurality of slits 82s are formed in a bottom part of the Faraday shield plate 82. Each slit 82s extends so as to be approximately perpendicular to a corresponding side of the antenna 85 having a planar shape that is an approximately octagonal shape.

As illustrated in FIG. 7 and FIG. 8, the Faraday shield plate 82 has a support 82a, that is bent outward, and is provided at each of two upper ends of the Faraday shield plate 82. Because the supports 82a are supported on the upper surface of the frame member 81, the Faraday shield plate 82 is supported at a desired position in the frame member 81.

The insulating plate 83 is made of quartz glass, for example, and has a size slightly smaller than a size of the bottom surface of the Faraday shield plate 82. The insulating plate 83 is placed on the bottom surface of the Faraday shield plate 82. The insulating plate 83 insulates the Faraday shield plate 82 and the antenna 85 from each other, while transmitting a high-frequency wave radiated from the antenna 85 downward.

The antenna 85 is formed by winding a hollow tube (or pipe) made of copper three times, for example, to a planar shape that is an approximately octagonal shape. Cooling water can be circulated through the pipe, thereby preventing the antenna 85 from being heated to a high temperature by the high-frequency wave supplied to the antenna 85. The antenna 85 is provided with a stand 85a. A support 85b is attached to the stand 85a. The antenna 85 is maintained at a desired position in the Faraday shield plate 82 by the support 85b. A high-frequency power supply 87 is connected to the support 85b via a matching box 86. The high-frequency power supply 87 generates a high-frequency wave having a frequency of 13.56 MHz, for example.

According to the plasma generator 80, when high-frequency power is supplied from the high-frequency power supply 87 to the antenna 85 via the matching box 86, an electromagnetic field is generated by the antenna 85. Because an electric field component of the electromagnetic field is shielded by the Faraday shield plate 82, the electric field component cannot propagate downward. In contrast, a magnetic field component of the electromagnetic field can propagate into the reforming region P3 through the plurality of slits 82s of the Faraday shield plate 82. The mixture gas of the noble gas and the additive gas, supplied from the reforming gas nozzle 33 to the reforming region P3 at a desired flow rate ratio, is activated by the magnetic field component.

As illustrated in FIG. 1, the film forming apparatus according to one embodiment is provided with a controller 100, including a computer, and configured to control the operation of the entire film forming apparatus. A memory of the controller 100 stores a program for causing the film forming apparatus to perform a film forming method which will be described later, under a control of the controller 100. The program is embedded with a group of steps (or processes) so as to perform the film forming method which will be described later. The program is stored in a medium 102, such as a hard disk, a compact disk, a magneto-optical disk, a memory card, a flexible disk, or the like, is read into a storage 101 by a desired reading device or reader, and installed in the controller 100. In other words, the computer may be formed by a processor, and the program stored in a non-transitory computer-readable storage medium may be executed by the processor to cause the film forming apparatus to perform the film forming method which will be described later.

[Film Forming Method]

The film forming method according to one embodiment will be described with reference to FIG. 10 through FIG. 15. Hereinafter, a case where a titanium oxide film is formed on the surface of the substrate W by the film forming apparatus described above, will be described as an example. FIG. 10 through FIG. 15 are cross sectional views illustrating the film forming method according to one embodiment.

Figure 10:
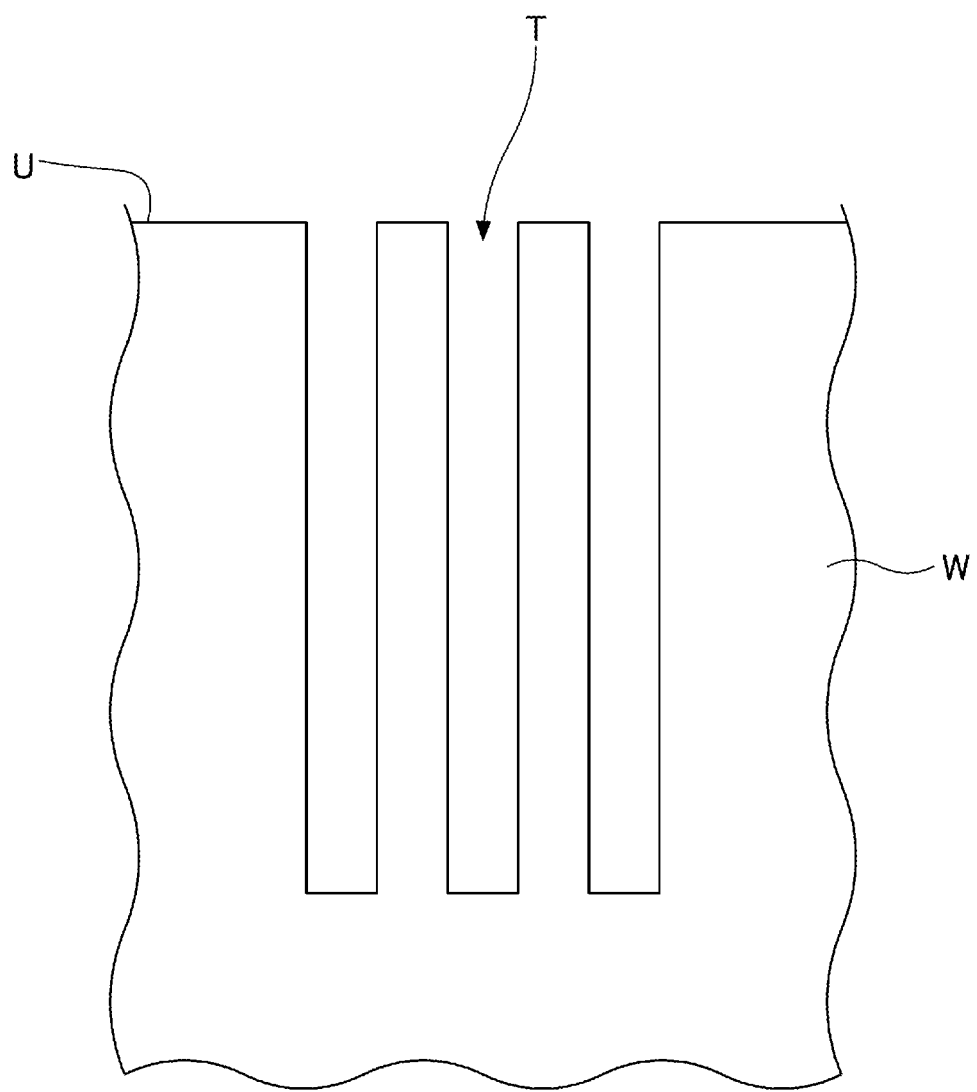
FIG. 10 is a cross sectional view (part 1) illustrating a film forming method according to one embodiment.

FIG. 10 is a diagram illustrating an example of a surface pattern of the substrate W used in the film forming method according to one embodiment. As illustrated in FIG. 10, the substrate W having a plurality of trenches T on a surface thereof is prepared. The substrate W is a silicon wafer, for example.

Next, the gate valve (not illustrated) is opened, and the substrate W is transported into the recess 24 of the turntable 2 from the outside by the transport arm 10 illustrated in FIG. 3, through the transport port 15 illustrated in FIG. 2 and FIG. 3. When the recess 24 stops at a position facing the transport port 15, the substrate W is transported by the raising and lowering pins (not illustrated), that are inserted into the through holes penetrating the bottom surface of the recess 24, and are raised and lowered relative to the bottom part of the vacuum chamber 1. The transport of the substrate W is performed by intermittently rotating the turntable 2, and the substrate W is placed in each of the five recesses 24 of the turntable 2.

Next, the gate valve is closed, and the vacuum chamber 1 is evacuated to a degree of vacuum reachable by the vacuum pump 640. Next, the nitrogen gas is discharged from the separation gas nozzles 41 and 42 as the separation gas, at desired flow rates, and the nitrogen gas is also discharged from the separation gas supply pipe 51 and the purge gas supply pipes 72 and 73 at desired flow rates. Further, the inside of the vacuum chamber 1 is controlled to a preset processing pressure by the pressure controller 650 illustrated in FIG. 1. Next, the substrates W are heated by the heater unit 7 to 200° C., for example, while the turntable 2 is rotated clockwise at a high rotation speed of 120 rpm, for example.

Next, the organic amino titanium gas is supplied from the source gas nozzle 31 illustrated in FIG. 2 and FIG. 3, and a hydrogen peroxide gas is supplied from the reactive gas nozzle 32. In this state, the source gas nozzle 31 supplies the organic amino titanium gas from each discharge hole 31h at the first angle θ1 with respect to the vertically downward direction. The reactive gas nozzle 32 supplies the hydrogen peroxide gas from each discharge hole 32h at the second angle θ2 with respect to the vertically downward direction.

Next, by the rotation of the turntable 2, each substrate W repeatedly passes through the adsorption region P1, the separation region D, the oxidation region P2, and the separation region D in this order, as illustrated in FIG. 3.

Figure 11:
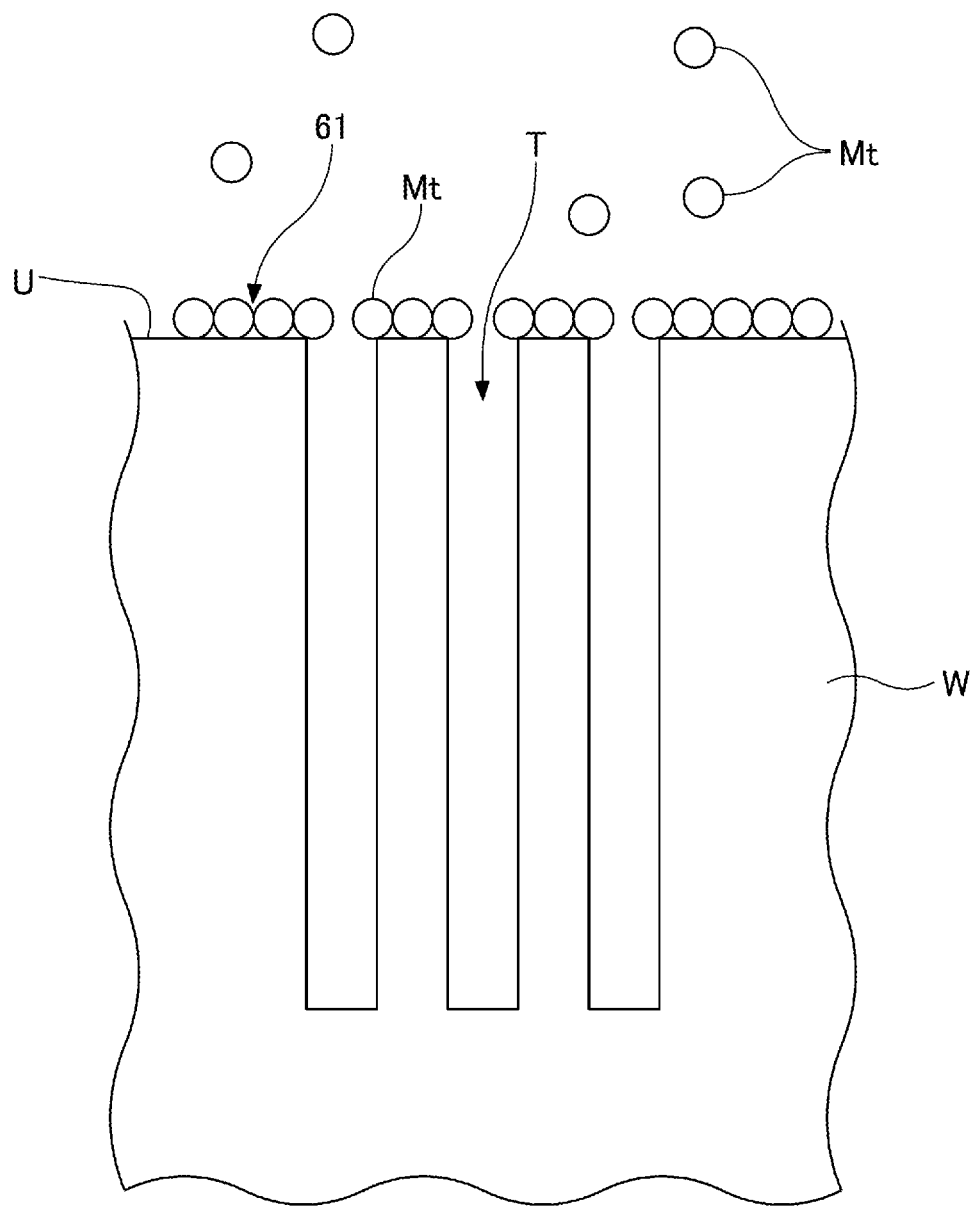
FIG. 11 is a sectional view (part 2) illustrating the film forming method according to one embodiment.

FIG. 11 is a diagram illustrating an example of the adsorption process (or step). As illustrated in FIG. 11, in the adsorption region P1, molecules Mt of the organic amino titanium gas are adsorbed on a surface U of the substrate W, to form a molecular layer 61 of the organic amino titanium. The organic amino titanium gas is supplied at the first angle θ1 with respect to a depth direction of the trench T. In this case, because the molecules Mt of the organic amino titanium cannot easily reach a deep portion of the trench T, the molecules Mt are easily adsorbed onto the surface U of the substrate W. The molecule Mt of the organic amino titanium gas has an organic group attached to a periphery of the metal that is titanium, in the organic metal gas, and a diameter of the molecule Mt is large. Further, the turntable 2 is rotated at the high rotation speed. For this reason, the molecules Mt of the organic amino titanium do not reach the deep portion of the trench T, and are adsorbed on the surface U of the substrate W.

Figure 12:
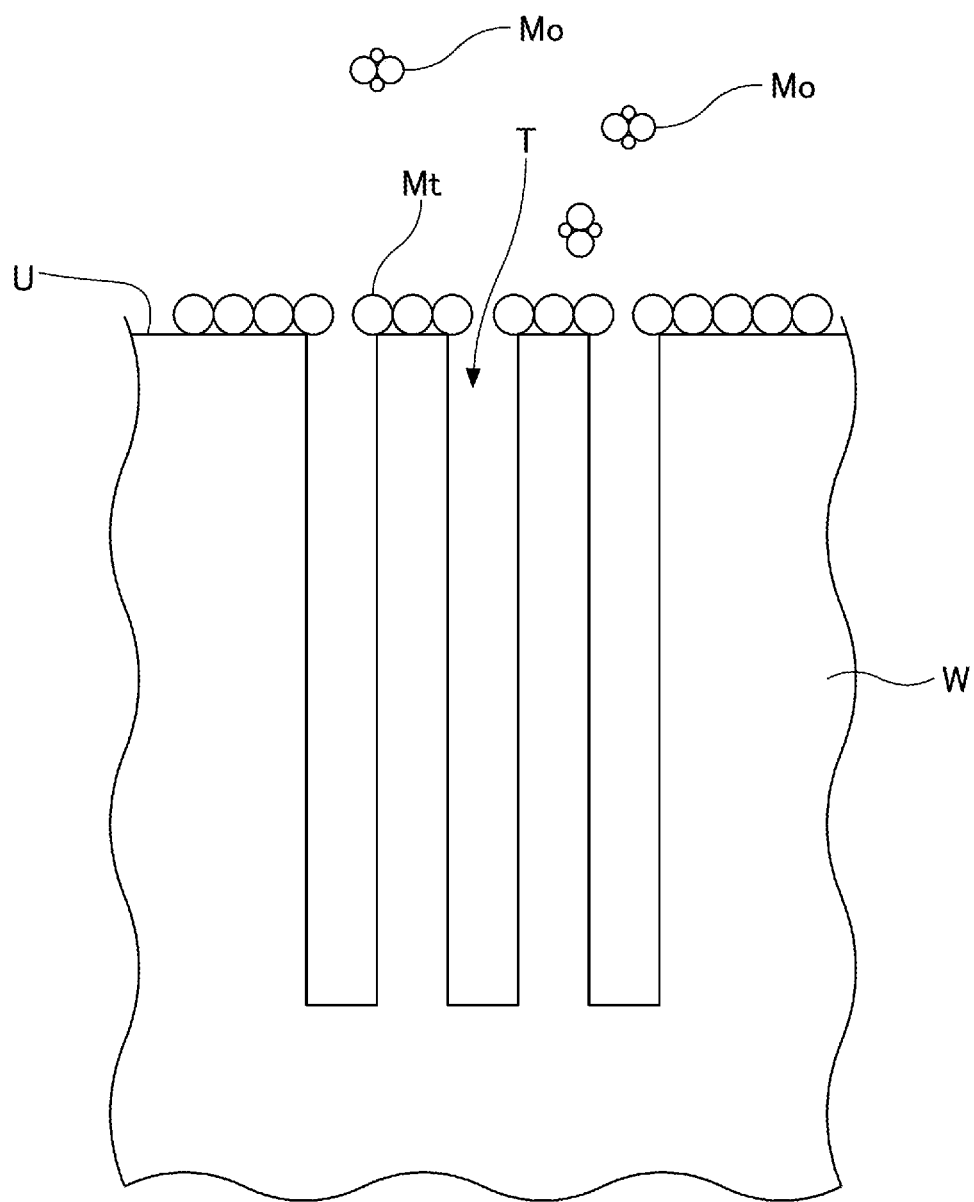
FIG. 12 is a cross sectional view (part 3) illustrating the film forming method according to one embodiment.
Figure 13:
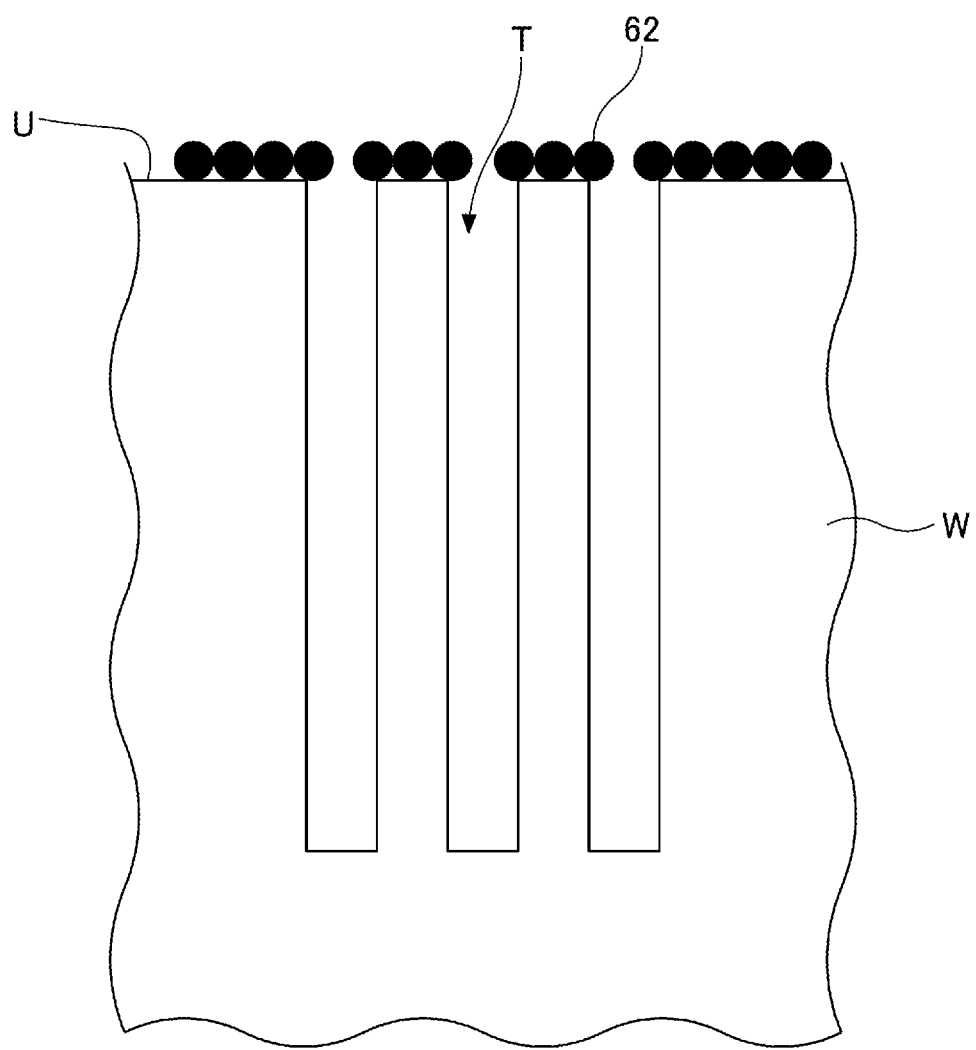
FIG. 13 is a sectional view (part 4) illustrating the film forming method according to one embodiment.

FIG. 12 and FIG. 13 are diagrams illustrating an example of the oxidation process (or step). As illustrated in FIG. 12, after passing through the separation region D, the organic amino titanium gas adsorbed on the surface U of the substrate W is oxidized by hydrogen peroxide gas molecules Mo in the oxidation region P2. As a result, as illustrated in FIG. 13, a titanium oxide film 62 is formed on the surface U of the substrate W at the upper end of the trench T. The hydrogen peroxide gas is supplied at the second angle θ2 with respect to the depth direction of the trench T. In this case, because the hydrogen peroxide gas molecules Mo cannot easily reach the deep portion of the trench T, the titanium oxide film 62 is easily formed on the surface U of the substrate W. Further, because the turntable 2 is rotated at the high rotation speed, the hydrogen peroxide gas molecules Mo do not reach the deep portion of the trench T, and the titanium oxide film 62 is formed on the surface U of the substrate.

Figure 14:
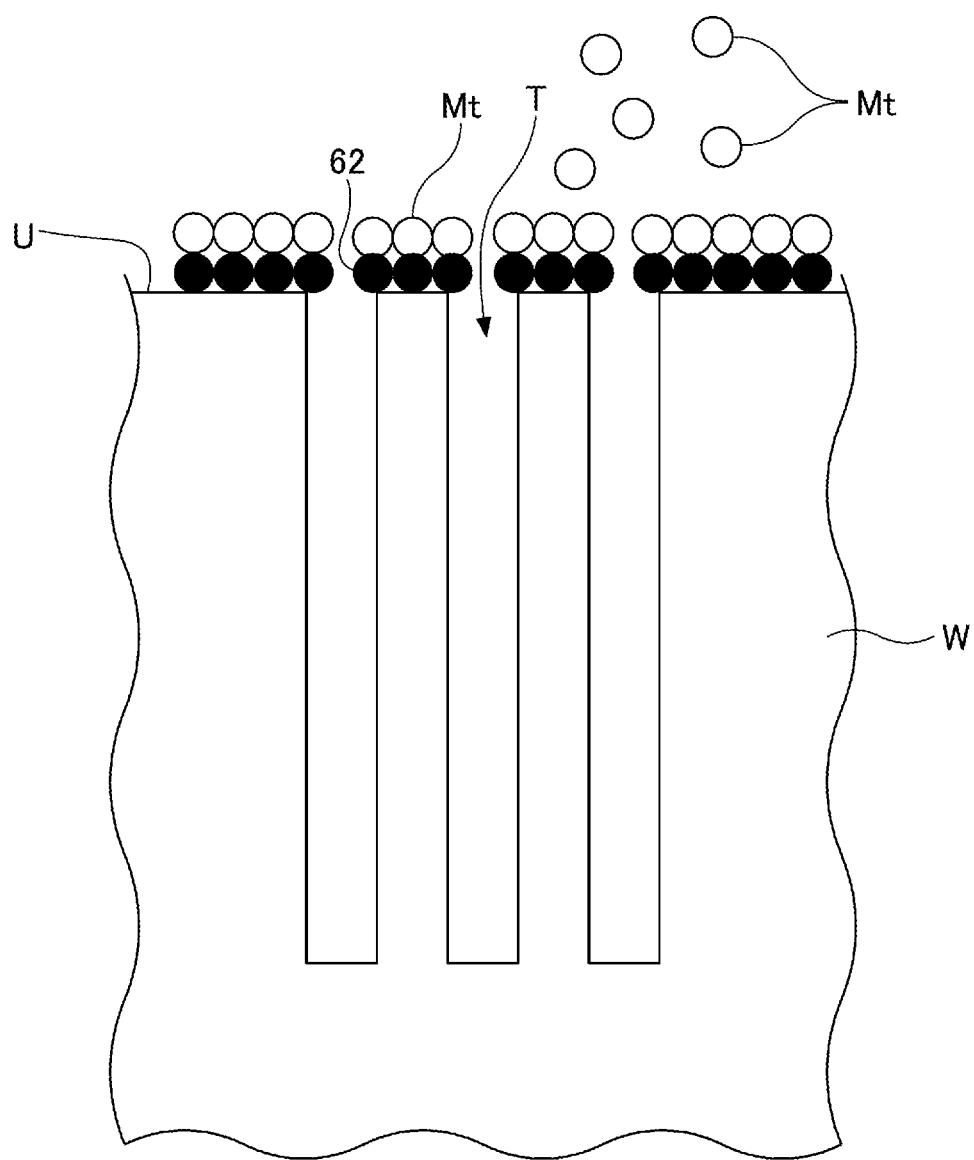
FIG. 14 is a sectional view (part 5) illustrating the film forming method according to one embodiment.

FIG. 14 is a diagram illustrating an example of the adsorption process (or step) that is repeated again. As illustrated in FIG. 14, when the substrate W reaches the adsorption region P1 again by the rotation of the turntable 2, the molecules Mt of the organic amino titanium gas supplied from the source gas nozzle 31 are adsorbed on the surface U of the substrate W. Similar to the adsorption process (or step) described above, the organic amino titanium molecules Mt do not reach the deep portion of the trench T, and are adsorbed onto the surface U of the substrate W.

Figure 15:
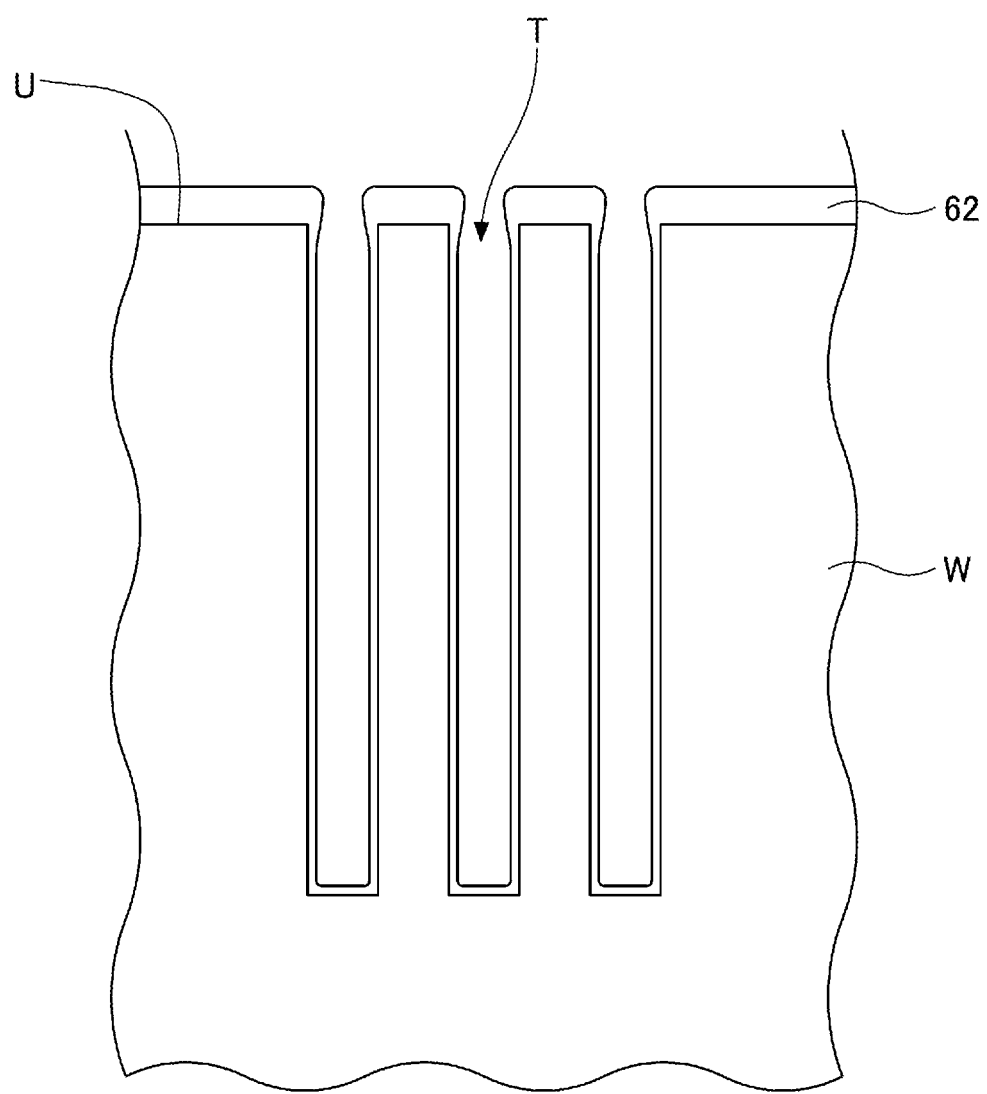
FIG. 15 is a sectional view (part 6) illustrating the film forming method according to one embodiment.

Thereafter, the adsorption process (or step) and the oxidation process (or step) are repeated while the turntable 2 continues to rotate at the high rotation speed, and as illustrated in FIG. 15, the titanium oxide film 62 having a helmet shape, covering the upper surface and the upper portion of the side surface of the convex portion, is formed on the surface (on the convex portion) of the substrate W between the mutually adjacent trenches T.

As described above, according to the film forming method of one embodiment, the organic amino titanium gas and the hydrogen peroxide gas are supplied at angles with respect to the depth direction of the trench T. As a result, the thickness of the titanium oxide film 62 formed on the upper portion of the convex portion becomes greater than the thickness of the titanium oxide film 62 formed on the lower portion of the convex portion. In addition, the thickness of the titanium oxide film 62 formed on the upper surface of the convex portion tends to become greater than the thickness of the titanium oxide film 62 formed on the side surface of the convex portion. As a result, it is possible to form a film having the helmet shape with minimized overhang (that is, low overhang ratio).

Moreover, according to the film forming method of one embodiment, the organic metal gas having a large molecular diameter is supplied as the source gas from the source gas nozzle 31, and the turntable 2 is rotated at the high rotation speed. Thus, the titanium oxide film 62 can be formed locally by selectively forming the film only in the region between the adjacent trenches T, without progressing the film formation inside the trenches T. The embodiment described above uses the organic amino titanium gas as the source gas. However, because the organic metal gas generally has a large molecular diameter, the film forming method according to the embodiment may be performed using other kinds of organic metal gas. Furthermore, not only the organic metal gas but also the organic semimetal gas, such as the organic silane gas or the like, has a large molecular diameter, and thus, the film forming method according to the embodiment may be performed using the organic semimetal gas in place of the organic metal gas.

In the film forming method according to the embodiment described above, both the source gas and the oxidizing gas are supplied at angles with respect to the vertically downward direction, but the present disclosure is not limited thereto. For example, the source gas may be supplied vertically downward, and the oxidizing gas may be supplied at an angle with respect to the vertically downward direction. For example, the source gas may be supplied at an angle with respect to the vertically downward direction, and the oxidizing gas may be supplied vertically downward. As described above, it is sufficient to supply at least one of the source gas and the oxidizing gas at an angle with respect to the vertically downward direction.

In the film forming method according to the embodiment described above, the titanium oxide film is formed, but the present disclosure is not limited thereto. For example, when forming a titanium nitride film, the kind of gas supplied from the reactive gas nozzle 32 may be changed from the hydrogen peroxide gas to a nitriding gas, such as an ammonia gas or the like.

[Exemplary Implementations]

In exemplary implementations, a substrate having a plurality of convex portions was prepared, the prepared substrate was accommodated inside the vacuum chamber 1 of the film forming apparatus described above, and a titanium dioxide film was formed on the substrate under the following conditions A1 and A2.

<Condition A1>

Under the condition A1, the adsorption process (or step) and the oxidation process (or step) described above were continuously performed in this order, in a state where the first angle θ1 is set to 70° and the second angle θ2 is set to 90°, to form a titanium oxide film. That is, under the condition A1, the source gas was supplied at an angle of 70° with respect to the vertically downward direction during the adsorption process, and the oxidizing gas was supplied parallel to the surface of the substrate during the oxidation process. In the adsorption process, a TDMAT gas was supplied as the source gas. In the oxidation process, a hydrogen peroxide gas was supplied as the oxidizing gas.

<Condition A2>

Under the condition A2, the second angle θ2 was set to 0°. Other conditions were the same as those of the condition A1. That is, under the condition A2, the source gas was supplied at an angle of 70° with respect to the vertically downward direction during the adsorption process, and the oxidizing gas was supplied perpendicularly to the surface of the substrate during the oxidation process.

Next, the thickness T1 on the bottom surface of the trench, the thickness T2 on the region between the adjacent trenches, and the thickness T3 on the upper portion of the side surface of the trench, respectively illustrated in FIG. 9, were measured with respect to the titanium oxide film formed on the surface of the substrate. In addition, the overhang ratio was calculated from the thickness T2 and the thickness T3.

In the titanium dioxide film formed on the surface of the substrate under the condition A1, the thickness T1 was 4.4 nm, the thickness T2 was 11.8 nm, and the thickness T3 was 7.7 nm. The overhang ratio was 65%.

In the titanium dioxide film formed on the surface of the substrate under the condition A2, the thickness T1 was 5.5 nm, the thickness T2 was 12.1 nm, and the thickness T3 was 8.7 nm. The overhang ratio was 72%.

From the above results, it was confirmed that the overhang of the titanium oxide film formed on the convex portion can be minimized by supplying the oxidizing gas in parallel to the surface of the substrate during the oxidation process, compared to supplying the oxidizing gas perpendicularly to the surface of the substrate during the oxidation process.

Next, a cycle rate, an in-plane uniformity of the film thickness, a refractive index, and a wet etching rate (WER) of the titanium oxide film formed on the surface of the substrate were measured. The cycle rate was computed by measuring the thickness of the titanium oxide film, and dividing the measured thickness of the titanium oxide film by a number of times the adsorption process and the oxidation process are repeated. The WER refers to an etching rate for a case where the titanium oxide film is etched using a dilute hydrofluoric acid (DHF).

The cycle rate of the titanium dioxide film formed on the surface of the substrate under the condition A1 was 0.198 Å/cycle. The cycle rate of the titanium dioxide film formed on the surface of the substrate under the condition A2 was 0.197 Å/cycle. From these results, it was confirmed that the cycle rate of the titanium dioxide film formed on the surface of the substrate under the condition A1, and the cycle rate of the titanium dioxide film formed on the surface of the substrate under the condition A2, are approximately the same. In addition, it was confirmed that a titanium oxide film having a helmet shape with minimized overhang (low overhang ratio) can be formed at a relatively high cycle rate of approximately 0.2 Å/cycle.

In addition, it was confirmed that the in-plane uniformity of the titanium dioxide film formed on the surface of the substrate under the condition A1, and the in-plane uniformity of the titanium dioxide film formed on the surface of the substrate under the condition A2, are approximately the same.

Figure 16:
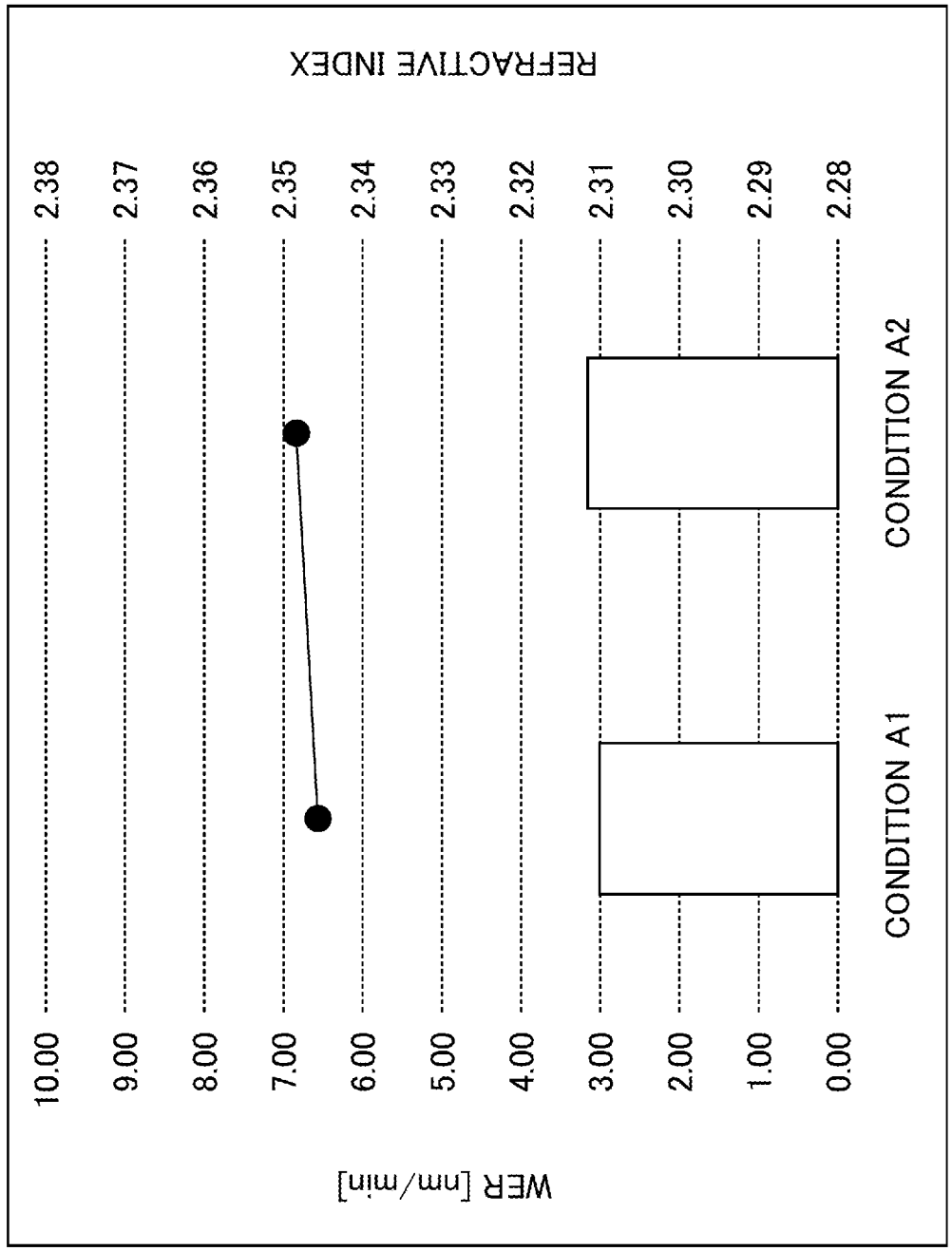
FIG. 16 is a diagram illustrating a wet etching rate and refractive index characteristics of a titanium oxide film formed on the surface of the substrate.

FIG. 16 is a diagram illustrating the WER and refractive index of the titanium oxide film formed on the surface of the substrate. In FIG. 16, the left ordinate indicates the WER [nm/min], and the right ordinate indicates the refractive index. In FIG. 16, bar graphs indicate the measurement results of the WER, and black circular marks "●" indicate the measurement results of the refractive index.

As illustrated in FIG. 16, it can be seen that the WER and the refractive index of the titanium dioxide film formed on the surface of the substrate under the condition A1, and the titanium dioxide film formed on the surface of the substrate under the condition A2, are approximately the same, respectively.

From the above results, it was confirmed that the film characteristics of the titanium oxide film are substantially unaffected by the varying of the direction in which the oxidizing gas is supplied during the oxidation process.

Therefore, according to the present disclosure, the overhang can be minimized.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising:
    causing adsorption of a source gas on a surface of a substrate having a convex portion on the surface, by supplying the source gas to the surface of the substrate at a first angle with respect to a vertically downward direction that is perpendicular to the surface of the substrate; and
    forming a film on the surface of the substrate using a thermal reaction between the source gas adsorbed on the surface of the substrate and a reactive gas, by supplying the reactive gas to the surface of the substrate at a second angle with respect to the vertically downward direction, wherein
    the first angle is smaller than the second angle,
    the substrate is one of a plurality of substrates disposed on a surface of a turntable provided inside a vacuum chamber along a circumferential direction of the turntable,
    an adsorption region in which the causing is performed, and a reaction region in which the forming is performed, are provided inside the vacuum chamber above the turntable along the circumferential direction of the turntable, and
    the causing and the forming are repeated with respect to the substrate by rotating the turntable in a state where the source gas is supplied to the adsorption region from a source gas supply and the reactive gas is supplied to the reaction region from a reactive gas supply.

2. The film forming method as claimed in claim 1, wherein the source gas supply and the reactive gas supply supply the gas toward a downstream side in a rotation direction of the turntable.

3. The film forming method as claimed in claim 1, wherein the first angle is in a range greater than or equal to 60° and less than or equal to 80°.

4. The film forming method as claimed in claim 1, wherein the second angle is in a range greater than or equal to 80° and less than or equal to 100°.

5. The film forming method as claimed in claim 1, wherein:
    the source gas is an organic metal gas or an organic semimetal gas, and
    the reactive gas is an oxidizing gas.

6. The film forming method as claimed in claim 1, wherein:
    the source gas is an organic metal gas or an organic semimetal gas, and
    the reactive gas is a nitriding gas.

7. The film forming method as claimed in claim 1, wherein the causing and the forming are repeated with respect to each of the plurality of substrates by rotating the turntable.

8. The film forming method as claimed in claim 1, wherein:
   the first angle is in a range greater than or equal to 60° and less than or equal to 80°, and
   the second angle is in a range greater than or equal to 80° and less than or equal to 100°.

* * * * *